US008963414B2

(12) United States Patent
Sawabe et al.

(10) Patent No.: US 8,963,414 B2
(45) Date of Patent: Feb. 24, 2015

(54) ORGANIC ELECTROLUMINESCENT DEVICE, LIGHTING APPARATUS, AND METHOD FOR MANUFACTURING THE ORGANIC ELECTROLUMINESCENT DEVICE

(71) Applicants: Tomoaki Sawabe, Tokyo (JP); Tomio Ono, Kanagawa-ken (JP); Keiji Sugi, Kanagawa-ken (JP); Shintaro Enomoto, Kanagawa-ken (JP)

(72) Inventors: Tomoaki Sawabe, Tokyo (JP); Tomio Ono, Kanagawa-ken (JP); Keiji Sugi, Kanagawa-ken (JP); Shintaro Enomoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 13/711,769

(22) Filed: Dec. 12, 2012

(65) Prior Publication Data
US 2013/0182418 A1 Jul. 18, 2013

(30) Foreign Application Priority Data
Jan. 17, 2012 (JP) ................. 2012-007139

(51) Int. Cl.
*H01L 51/52* (2006.01)
*F21L 4/00* (2006.01)
*H01L 51/56* (2006.01)

(52) U.S. Cl.
CPC ............ *H01L 51/52* (2013.01); *H01L 51/5212* (2013.01); *H01L 51/5268* (2013.01); *F21L 4/00* (2013.01); *H01L 51/56* (2013.01); *H01L 51/5225* (2013.01); *H01L 2251/5361* (2013.01)
USPC ............ 313/504; 313/505; 313/506

(58) Field of Classification Search
CPC ............ H01L 51/52; H01L 51/56; F21L 4/00
USPC .................................. 313/498–512
See application file for complete search history.

(56) References Cited

U.S. PATENT DOCUMENTS

2005/0029930 A1* 2/2005 Yamazaki ..................... 313/503
2007/0077349 A1 4/2007 Newman et al.
(Continued)

FOREIGN PATENT DOCUMENTS

JP 9-326232 12/1997
JP 10-307296 11/1998
(Continued)

OTHER PUBLICATIONS

The Extended European Search Report issued Jun. 10, 2013, in Application No. / Patent No. 12198509.7-1555.
(Continued)

*Primary Examiner* — Elmito Breval
(74) *Attorney, Agent, or Firm* — Oblon, Spivak, McClelland, Maier & Neustadt, L.L.P.

(57) ABSTRACT

According to one embodiment, an organic electroluminescent device includes first and second electrodes, an interconnection layer, an organic light emitting layer and a light scattering layer. The first electrode has includes first, second and third portions. The interconnection layer is electrically connected to the first electrode. The third portion overlays the interconnection layer when projected to the plane. The first and second portions do not overlay the interconnection layer. The second electrode overlays the second portion and does not overlay the first and the third portions. The organic light emitting layer is provided between the second portion and the second electrode. The second portion is disposed between the fourth portion of the light scattering layer and the second electrode. The fifth portion of the light scattering layer overlays the interconnection layer. The light scattering layer does not overlay the first portion when projected to the plane.

18 Claims, 15 Drawing Sheets

(56) References Cited

U.S. PATENT DOCUMENTS

| | | |
|---|---|---|
| 2009/0174319 A1 | 7/2009 | Shimoji |
| 2009/0206733 A1* | 8/2009 | Hwang et al. ............... 313/504 |
| 2009/0262545 A1 | 10/2009 | Amelung et al. |
| 2011/0193477 A1 | 8/2011 | Lifka et al. |
| 2012/0228591 A1 | 9/2012 | Sawabe et al. |
| 2013/0092914 A1 | 4/2013 | Lifka et al. |

FOREIGN PATENT DOCUMENTS

| | | |
|---|---|---|
| JP | 2004-349244 | 12/2004 |
| JP | 2004-363040 | 12/2004 |
| JP | 2005-11810 | 1/2005 |
| JP | 2006-294484 | 10/2006 |
| JP | 2009-152148 | 7/2009 |
| JP | 2011-2336 | 1/2011 |
| JP | 2011-34996 | 2/2011 |
| WO | WO 2010/041611 A1 | 4/2010 |
| WO | WO 2010/046833 A1 | 4/2010 |
| WO | WO 2011/158185 A1 | 12/2011 |

OTHER PUBLICATIONS

U.S. Appl. No. 14/045,133, filed Oct. 3, 2013, Ono, et al.
U.S. Appl. No. 14/077,644, filed Nov. 12, 2013, Sawabe, et al.
Office Action issued Oct. 29, 2014 in Japanese Patent Application No. 2012-007139 (with English translation).

* cited by examiner

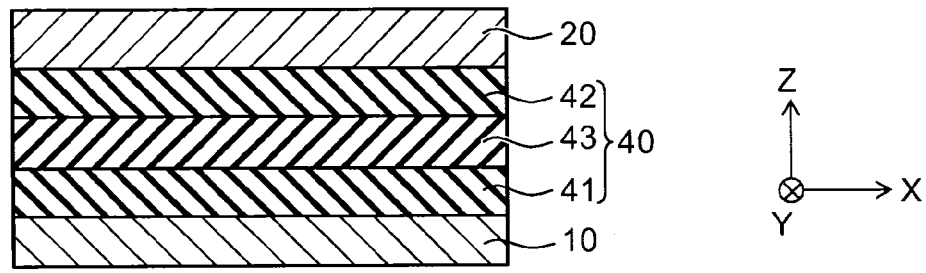
FIG. 5
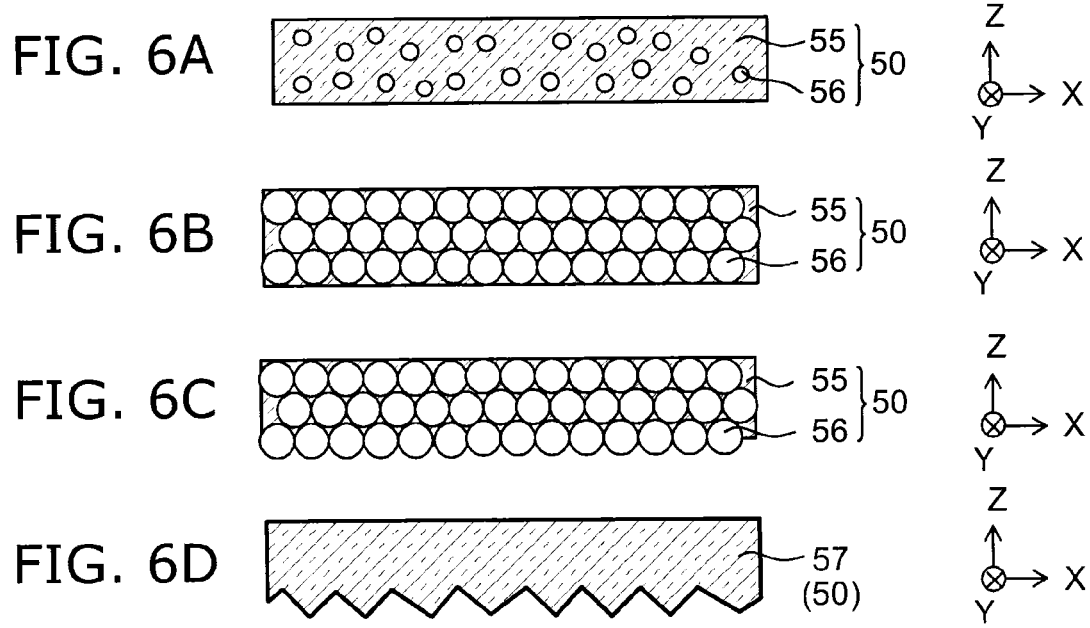
FIG. 6A
FIG. 6B
FIG. 6C
FIG. 6D

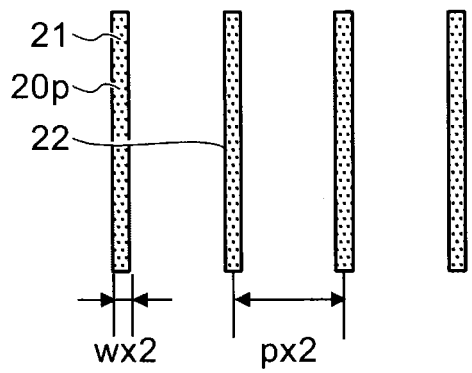
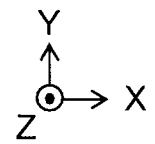
FIG. 8A
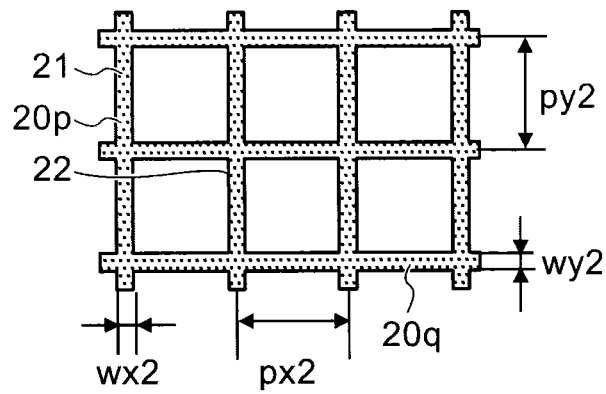
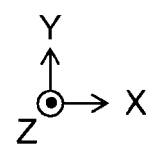
FIG. 8B
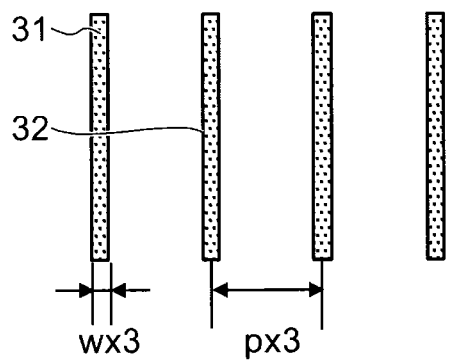
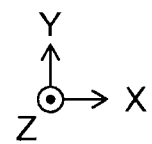
FIG. 9A
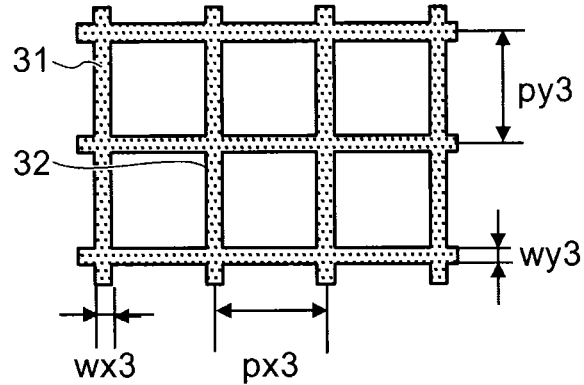
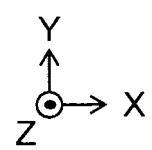
FIG. 9B $I = (Io + Is)RbTo + IsRo$ $I = IsRbTo + IsRo$ $I = IsRbTo + Io + IsRo'$ $I = IsRbTo + IsRo'$

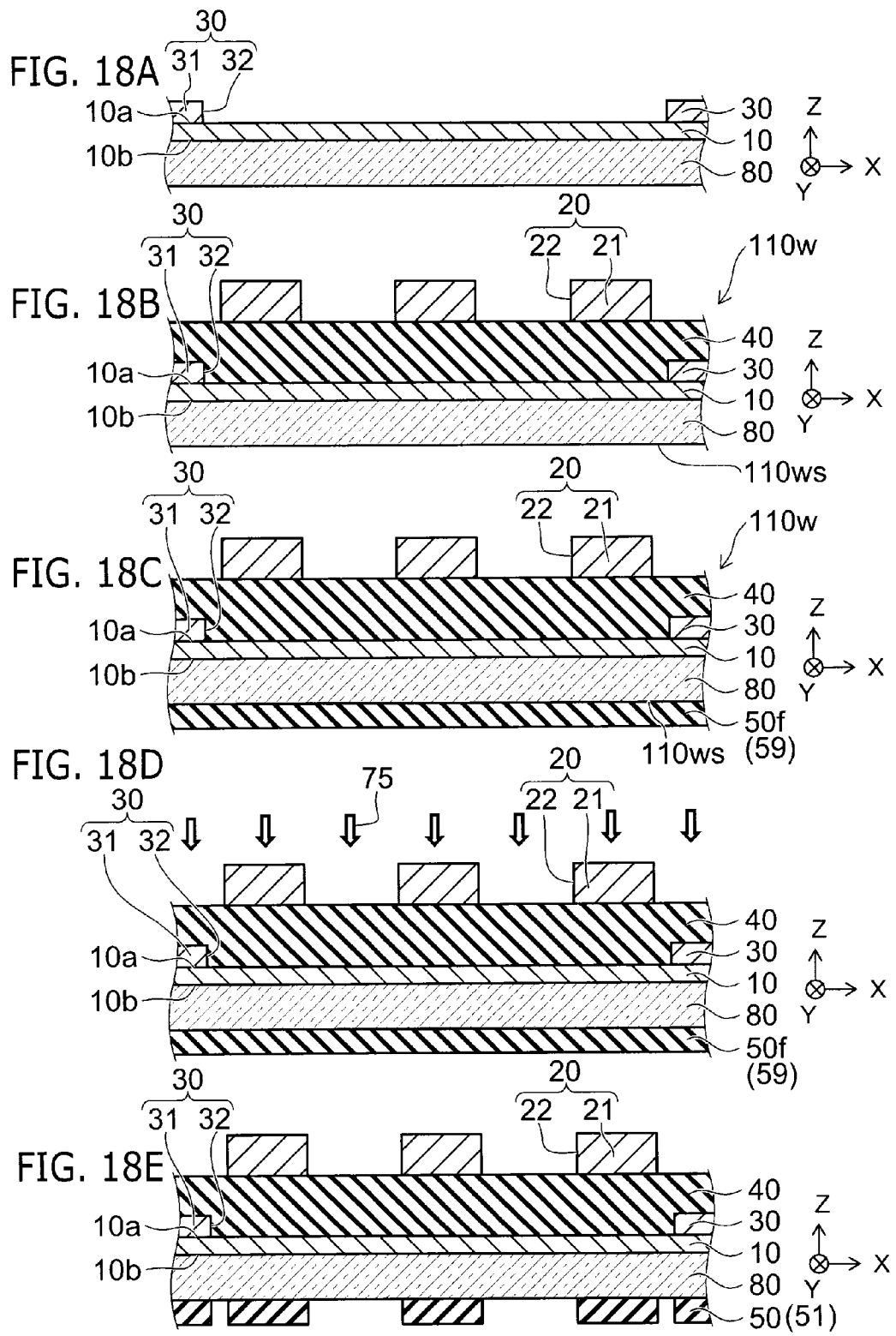

US 8,963,414 B2

ORGANIC ELECTROLUMINESCENT DEVICE, LIGHTING APPARATUS, AND METHOD FOR MANUFACTURING THE ORGANIC ELECTROLUMINESCENT DEVICE

CROSS-REFERENCE TO RELATED APPLICATIONS

This application is based upon and claims the benefit of priority from the prior Japanese Patent Application No. 2012-007139, filed on Jan. 17, 2012; the entire contents of which are incorporated herein by reference.

FIELD

Embodiments described herein relate generally to an organic electroluminescent device, a lighting apparatus, and a method for manufacturing the electroluminescent device.

BACKGROUND

Recently, organic electroluminescent devices have been attracting attentions for use as a flat light source. In the organic electroluminescent device, an organic thin film is provided between two electrodes. By applying a voltage to the organic thin film to inject electrons and holes so that they may be recombined, excitons are produced. When the excitons are radiatively deactivated, light is emitted and utilized.

Due to their features such as thinness, lightweight, and large area surface emission, the organic electroluminescent devices are expected to find applications that have not been able to be realized with the conventional lighting equipment and light sources.

BRIEF DESCRIPTION OF THE DRAWINGS

FIG. 5 is a schematic cross-sectional view illustrating a portion of the organic electroluminescent device according to the first embodiment;

FIG. 6A to FIG. 6D are schematic cross-sectional views illustrating portions of the organic electroluminescent device according to the first embodiment;

FIG. 8A and FIG. 8B are schematic plan views illustrating the organic electroluminescent device according to the first embodiment;

FIG. 9A and FIG. 9B are schematic plan views illustrating the organic electroluminescent device according to the first embodiment;

FIG. 18A to FIG. 18E are schematic cross-sectional views illustrating a method for manufacturing an organic electroluminescent device according to a third embodiment in order of processes;

DETAILED DESCRIPTION

Figure 1:
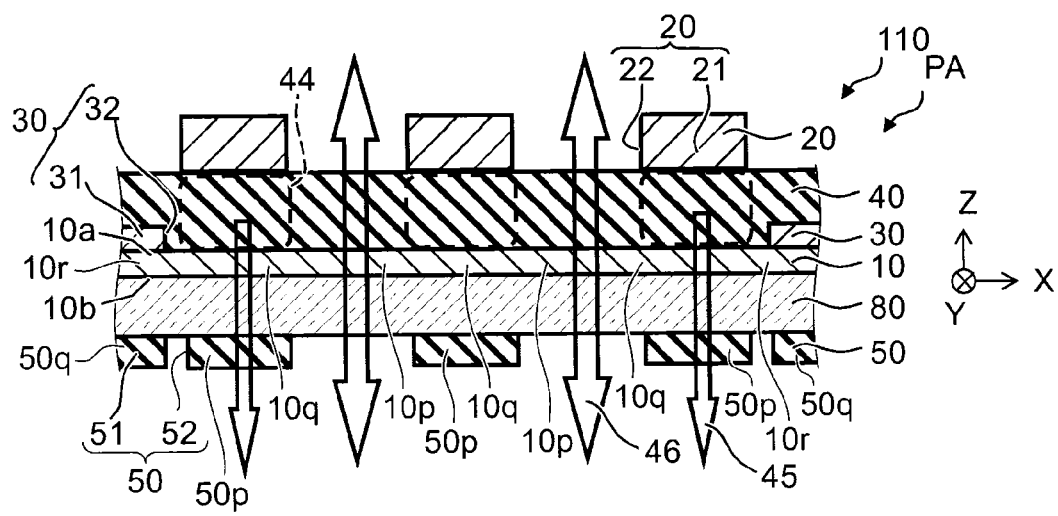
FIG. 1 is a schematic cross-sectional view illustrating an organic electroluminescent device according to a first embodiment.

According to one embodiment, an organic electroluminescent device includes: a first electrode; an interconnection layer; a second electrode; an organic light emitting layer; and a light scattering layer. The first electrode has a major surface and includes a first portion, a second portion arranged with the first portion in a first direction parallel to the major surface and a third portion arranged with the first portion in the first direction. The first electrode is light transmissive. The interconnection layer extends in a plane parallel to the major surface. The interconnection layer is light-reflective and electrically connected to the first electrode. The interconnection layer has a conductivity higher than a conductivity of the first electrode. The third portion overlays the interconnection layer when projected to the plane. The first portion and the second portion do not overlay the interconnection layer when projected to the plane. The second electrode is light-reflective. The second electrode overlays the second portion and does not overlay the first portion and the third portion when projected to the plane. The organic light emitting layer is provided between the second portion and the second electrode. The light scattering layer includes a fourth portion and a fifth portion arranged with the fourth portion in a direction parallel to the major surface. The second portion is disposed between the fourth portion and the second electrode. The fifth portion overlays the interconnection layer when projected to the plane. The light scattering layer does not overlay the first portion when projected to the plane.

According to another embodiment, a lighting apparatus includes an organic electroluminescent device and a power supply unit. The organic electroluminescent device includes a first electrode, an interconnection layer, a second electrode, an organic light emitting layer, and a light scattering layer. The first electrode has a major surface and includes a first portion, a second portion arranged with the first portion in a first direction parallel to the major surface and a third portion arranged with the first portion in the first direction. The first electrode is light transmissive. The interconnection layer extends in a plane parallel to the major surface. The interconnection layer is light-reflective and electrically connected to the first electrode. The interconnection layer has a conductivity higher than a conductivity of the first electrode. The third portion overlays the interconnection layer when projected to the plane. The first portion and the second portion do not overlay the interconnection layer when projected to the plane. The second electrode is light-reflective. The second electrode overlays the second portion and does not overlay the first portion and the third portion when projected to the plane. The organic light emitting layer is provided between the second portion and the second electrode. The light scattering layer includes a fourth portion and a fifth portion arranged with the fourth portion in a direction parallel to the major surface. The second portion is disposed between the fourth portion and the second electrode. The fifth portion overlays the interconnection layer when projected to the plane. The light scattering layer does not overlay the first portion when projected to the plane. The power supply unit is electrically connected to the interconnection layer and the second electrode, and configured to supply a current passing through the organic light emitting layer via the interconnection layer, the first electrode, and the second electrode.

According to another embodiment, a method is disclosed for manufacturing an organic electroluminescent device. The method can include preparing a workpiece. The workpiece includes: a first electrode having a major surface and including a first portion, a second portion arranged with the first portion in a first direction parallel to the major surface and third portion arranged with the first portion in the first direction, the first electrode being light transmissive; an interconnection layer extending in a plane parallel to the major surface, the interconnection layer being light-reflective and electrically connected to the first electrode, and having a conductivity higher than a conductivity of the first electrode, the third portion overlaying the interconnection layer when projected to the plane and the first portion and the second portion not overlaying the interconnection layer when projected to the plane; a second electrode being light-reflective, the second electrode overlaying the second portion and not overlaying the first portion and the third portion when projected to the plane; an organic light emitting layer provided between the second portion and the second electrode, the work piece having a processing surface parallel to the plane. The method can include forming a light scattering layer on the processing surface by exposure processing using the interconnection layer and the second electrode as masks. The light scattering layer includes a fourth portion and a fifth portion arranged with the fourth portion in a direction parallel to the major surface. The second portion is disposed between the fourth portion and the second electrode. The fifth portion overlays the interconnection layer when projected to the plane. The light scattering layer does not overlay the first portion when projected to the plane.

Various embodiments will be described hereinafter with reference to the accompanying drawings.

The drawings are schematic or conceptual, so that the relationship between thickness and width of each of the components and the size ratio between the components are not always realistic. Even the same component may be denoted with different sizes or ratios in the different drawings.

In the specification and the drawings, identical reference numerals are given to identical components in examples, and detailed description on the identical components will be omitted appropriately.

(First Embodiment)

FIG. 1 is a schematic cross-sectional view illustrating an organic electroluminescent device according to first embodiment.

Figure 2:
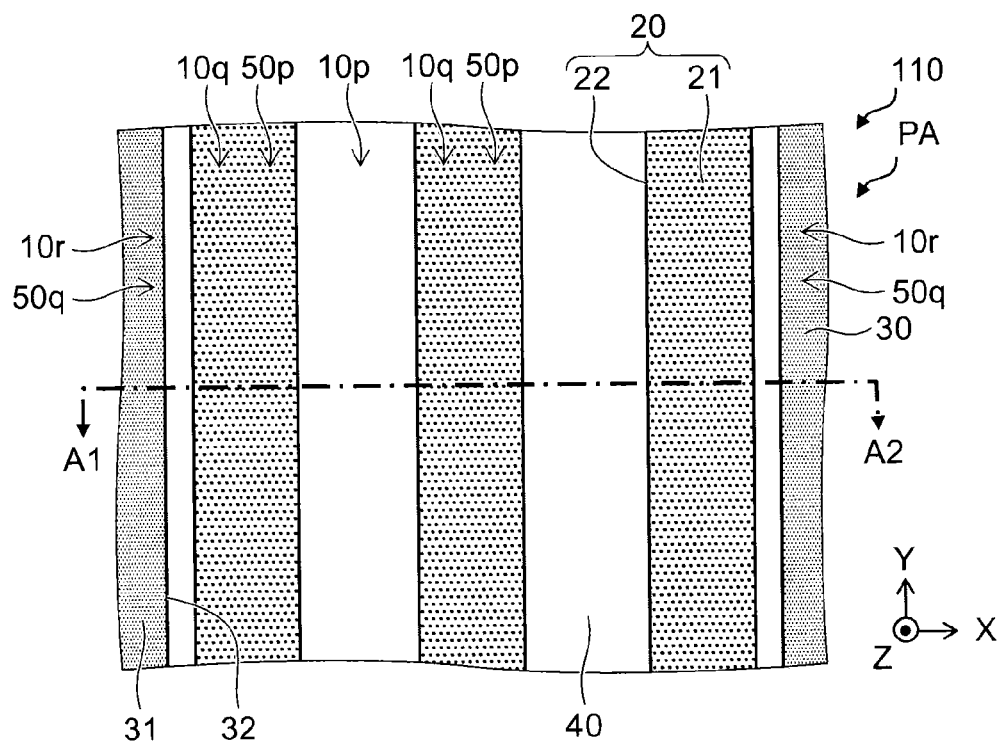
FIG. 2 is a schematic plan view illustrating the organic electroluminescent device according to the first embodiment.

FIG. 2 is a schematic plan view illustrating the organic electroluminescent device according to the first embodiment. FIG. 1 is a cross-sectional view taken along line A1-A2 of FIG. 2.

Those figures illustrate the organic electroluminescent device according to the embodiment by expanding a portion of this device.

As shown in FIG. 1 and FIG. 2, an organic electroluminescent device 110 according to the embodiment includes a first electrode 10, a second electrode 20, an interconnection layer 31, an organic light emitting layer 40, and a light scattering layer 51.

The first electrode 10 has a first major surface 10a and a second major surface 10b. The second major surface 10b is opposite to the first major surface 10a. The first electrode 10 is light transmissive. The first electrode 10 may be, for example, a transparent electrode.

In this example, the organic electroluminescent device 110 further includes a light transmissive substrate 80. The substrate 80 is provided between the first electrode 10 and the light scattering layer 51.

One direction parallel to the first major surface 10a is taken to be an X-axis direction. A direction parallel to the first major surface 10a and perpendicular to the X-axis is taken to be a Y-axis direction. A direction perpendicular to the X-axis and the Y-axis is taken to be a Z-axis direction. The Z-axis direction corresponds to the thickness direction of the first electrode 10.

The interconnection layer 31 extends in a plane parallel to the first major surface 10a. That is, the interconnection layer 31 extends in an X-Y plane. When projected to the X-Y plane, the first electrode 10 has a portion that does not overlay the interconnection layer 31.

For example, an interconnection portion 30 is provided, which includes the conductive interconnection layer 31. The interconnection layer 31 is provided except in an interconnection layer non-formation region 32. When projected to the X-Y plane, the interconnection layer non-formation region 32 overlays at least a portion of the first electrode 10. For example, the interconnection layer 31 overlays one portion of the first electrode 10 when projected to the X-Y plane. The interconnection layer 31 is electrically connected to the first electrode 10. For example, the interconnection layer 31 is shaped like a strip or grid structure extending in the X-Y plane.

As shown in FIG. 2, the interconnection layer 31 is strip-shaped in this example. However, as described later, the interconnection layer 31 may have an arbitrary pattern shape. The interconnection layer 31 has a higher conductivity than the first electrode 10. The interconnection layer 31 is light reflective. The interconnection layer 31 may be, for example, a metal electrode. The interconnection layer 31 functions as an auxiliary electrode configured to send a current flowing through the first electrode 10. In this example the interconnection layer 31 is provided on the first electrode 10. The interconnection layer 31 may be provided under the first electrode 10. The interconnection layer 31 is arranged to expose at least a portion of the first electrode 10.

The interconnection layer 31 has a higher optical reflectivity than the first electrode 10. In the specification of the application, the state of having a higher optical reflectivity than the first electrode 10 is referred to as being light reflective. An insulating layer (not shown) may be provided on the upper surface and side surface of the interconnection layer 31.

The second electrode 20 faces the first major surface 10a of the first electrode 10. The second electrode 20 is light reflective. That is, the second electrode 20 has a higher optical reflectivity than the first electrode 10.

The first electrode 10 has a higher optical transmittance than the interconnection layer 31 and the second electrode 20. In the specification, the state of having a higher optical transmittance than the interconnection layer 31 and the second electrode 20 is referred to as light transmissive. That is, the substrate 80 has a higher optical transmittance than the interconnection layer 31 and the second electrode 20.

The second electrode 20 has a conductive portion 21. The conductive portion 21 is light reflective. When projected to the X-Y plane, the conductive portion 21 overlays at least a portion of a region that does not overlay the interconnection layer 31. That is, the conductive portion 21 is provided except in a conductive portion non-formation region 22. When projected to the X-Y plane, the conductive portion non-formation region 22 is provided at least in a portion of the region that does not overlay the interconnection layer 31. In the second electrode 20, for example, a plurality of conductive portion non-formation regions 22 are provided. The conductive portion 21 is provided in a region other than the conductive portion non-formation region 22.

As shown in FIG. 2, in this example, the conductive portion 21 of the second electrode 20 is shaped like a strip. However, as described later, the conductive portion 21 of the second electrode 20 may have an arbitrary pattern shape.

The organic light emitting layer 40 is provided between the first major surface 10a of the first electrode 10 and the second electrode 20.

The first electrode 10 is provided between the light scattering layer 51 and the second electrode 20. The light scattering layer 51 has a portion that overlays the interconnection layer 31 and the conductive portion 21 when it is projected to the X-Y plane. That is, the light scattering layer 51 faces the light reflective portion due to the interconnection layer 31 and the second electrode 20. The light scattering layer 51 is provided except in at least a portion of the region that does not overlay the interconnection layer 31 or the conductive portion 21 when it is projected to the X-Y plane. The light scattering layer 51 is not provided in at least a portion of the region that overlays the conductive portion non-formation region 22 when it is projected to the X-Y plane. The light scattering layer 51 is not provided in at least a portion of the region that overlays the interconnection layer non-formation region 32 when it is projected to the X-Y plane.

For example, a light scattering portion 50 is provided. The light scattering portion 50 has the light scattering layer 51. A non-scattering portion 52 is provided in a region where the light scattering layer 51 is not provided. The light scattering performance of the non-scattering portion 52 is lower than that of the light scattering layer 51. The light scattering layer 51 has a portion that overlays the interconnection layer 31 and the conductive portion 21 when it is projected to the X-Y plane. When projected to the X-Y plane, the non-scattering portion 52 overlays at least a portion of the conductive portion non-formation region 22 and at least a portion of the interconnection layer non-formation region 32.

That is, as shown in FIG. 1 and FIG. 2, the first electrode 10 includes a first portion 10p, a second portion 10q and a third portion 10r. The second portion 10p is arranged with the first portion 10p in a first direction parallel to the first major surface 10a. The third portion 10r is arranged with the first portion 10p in the first direction.

The interconnection layer 31 extends in a plane parallel to the first major surface 10a. The interconnection layer 31 is light-reflective and electrically connected to the first electrode 10. The interconnection layer 31 has a conductivity higher than a conductivity of the first electrode 10. The third portion 10r overlays the interconnection layer 31 when projected to the plane. The first portion 10p and the second portion 10q do not overlay the interconnection layer 31 when projected to the plane.

The second electrode 20 is light-reflective. The second electrode 20 overlays the second portion 10q and does not overlay the first portion 10p and the third portion 10r when projected to the plane.

The organic light emitting layer 40 is provided between the second portion 10q and the second electrode 20.

The light scattering layer 51 including a fourth portion 50p and a fifth portion 50q. The fifth portion is arranged with the fourth portion 50q in a direction parallel to the first major surface 10a. The second portion 10q is disposed between the fourth portion 50p and the second electrode 20. The fifth portion 50q overlays the interconnection layer 31 when projected to the plane. The light scattering layer 51 does not overlay the first portion 10p when projected to the plane.

In this example in which the substrate 80 is provided, the light scattering layer 51 is partially provided on the major surface of the substrate 80. The light scattering layer 51 has substantially the same shape as the interconnection layer 31 and the conductive portion 21. The embodiment is not limited to it; the edge of the light scattering layer 51 may be either outside or inside the edge of the interconnection layer 31 and the conductive portion 21 when the layer 51 is projected to the X-Y plane. The non-scattering portion 52 overlays at least a portion of the conductive portion non-formation region 22 and at least a portion of the interconnection layer non-formation region 32 when projected to the X-Y plane, so that the organic electroluminescent device 110 becomes light transmissive.

As shown in FIG. 1, the organic light emitting layer 40 of the portion where the first electrode 10 and the second electrode 20 (conductive portion 21) face each other provides a light emitting region 44. Emitted light 45 produced by the light emitting region 44 goes out of the organic electroluminescent device 110 via the first electrode 10 and the light scattering layer 51. A portion of the emitted light 45 is reflected by the second electrode 20 and goes out via the first electrode 10 and the light scattering layer 51. A portion of those lights goes out via the non-scattering portion 52. By providing the light scattering layer 51, the path of the emitted light 45 is changed to reduce the light which may return into the device through, for example, total reflection, thereby enabling an efficient light extraction.

In the organic electroluminescent device 110, an external light 46 entering from the outside passes through the conductive portion non-formation region 22 of the second electrode 20, the interconnection layer non-formation region 32, and the first electrode 10. In such a manner, the organic electroluminescent device 110 can transmit the outside light 46 incident upon the organic electroluminescent device 110, while emitting the emitted light 45.

Since the non-scattering portion 52 (for example, a portion where the light scattering layer 51 is not provided) overlays the conductive portion non-formation region 22 and the interconnection layer non-formation region 32, the external light 46 is not scattered substantially when it passes through the conductive portion non-formation region 22, the interconnection layer non-formation region 32, and the first electrode 10. As a result, it is possible to form an image by using the external light 46 through the organic electroluminescent device 110. That is, the organic electroluminescent device 110 is light transmissive.

By providing the light scattering layer 51 at a position where the light reflective interconnection layer 31 and the conductive portion 21 overlay each other when projected to the X-Y plane, it is possible to scatter specular-reflection light at the interconnection layer 31 and the conductive portion 21. Accordingly, it is possible to suppress the reflected image of an external image from being visually recognized.

In such a manner, the light scattering layer 51 changes the direction in which the light emitted from the organic light emitting layer 40 travels. The light scattering layer 51 can scatter the light reflected by the interconnection layer 31 and the conductive portion 21. The light scattering layer 51 can scatter the external light 46 which is made incident upon at least one of the interconnection layer 31 and the conductive portion 21. A portion of the organic electroluminescent device 110 that overlays the conductive portion non-formation region 22 and does not overlay the light scattering layer 51 when it is projected to the X-Y plane is transparent. Another portion of the organic electroluminescent device 110 that overlays the interconnection layer non-formation region 32 and does not overlay the light scattering layer 51 when it is projected to the X-Y plane is transparent.

The organic electroluminescent device 110 according to the embodiment is light transmissive (transparent) as described above. Therefore, a background image can be visually recognized via the organic electroluminescent device 110. In this case, if an external image is specular-reflected by the interconnection layer 31 and the conductive portion 21, for example, the image of an observer himself is reflected by the interconnection layer 31 and the conductive portion 21, so that a resultant reflected image is visually recognized by the observer. That is, a reflected image of the external image occurs. It significantly deteriorates the visibility of the background image.

The organic electroluminescent device 110 according to the embodiment can transmit light and, at the same time, suppress the reflected image from being formed, thereby obtaining high visibility of the background image.

In such a manner, according to the embodiment, it is possible to provide a light transmissive and practical organic electroluminescent device. According to the embodiment, a high light emitting efficiency can be obtained. When the organic electroluminescent device is applied to a lighting apparatus, its lighting function and other functions to transmit a background image enable a variety of new applications.

For example, an organic EL display device may possibly have a configuration in which a plurality of pixels (light emitting regions) are provided and a light transmissive region is provided between the pixels. In this case, it is possible to suppress reflection by the reflecting electrode by using, for example, a circular polarization plate. However, the use of the circular polarization plate decreases the transmittance as well as transparency and also deteriorates the luminous efficiency. If the light scattering layer is provided to reduce the formation of reflection images in the light transmissive organic EL display device, a problem occurs in that the effective resolution may deteriorate in a plurality of pixels.

On the other hand, when an optical layer such as a circular polarization plate is used to suppress the formation of reflection images in a lighting apparatus which uses an organic electroluminescent device, the transmittance and the luminous efficiency decrease, thereby deteriorating usefulness. Further, in contrast to the display device, which provides different light emission for the different pixels, the use of the light scattering layer 51 in a lighting apparatus does not give rise to the problem in the deterioration of resolution. In the organic electroluminescent device 110 according to the embodiment, by using the light scattering layer 51, it is possible to obtain practical lighting functions and background image transmittance functions while suppressing the formation of reflection images.

Further, the organic EL display device has a small size of the pixels and thus, has no manifest problem of a drop in potential of the transparent electrode in the pixel.

On the other hand, if the organic electroluminescent device is applied to a large-area lighting apparatus, the emission luminance becomes non-uniform due to a potential drop caused by the resistance of the first electrode 10. In this case, in the embodiment, the low-resistance interconnection layer 31 is provided to the first electrode 10 and the potential drop is suppressed. If the interconnection layer 31 is made of a metal to provide the low-resistance interconnection layer 31, specular reflection occurs on the interconnection layer 31.

In the embodiment, the light scattering layer 51 has a portion that overlays the interconnection layer 31 and the conductive portion 21 when it is projected to the X-Y plane. It will suppress the formation of a reflection image owing to the second electrode 20 which faces the light emitting region 44 as well as the formation of a reflection image owing to the interconnection layer 31.

Figure 3:
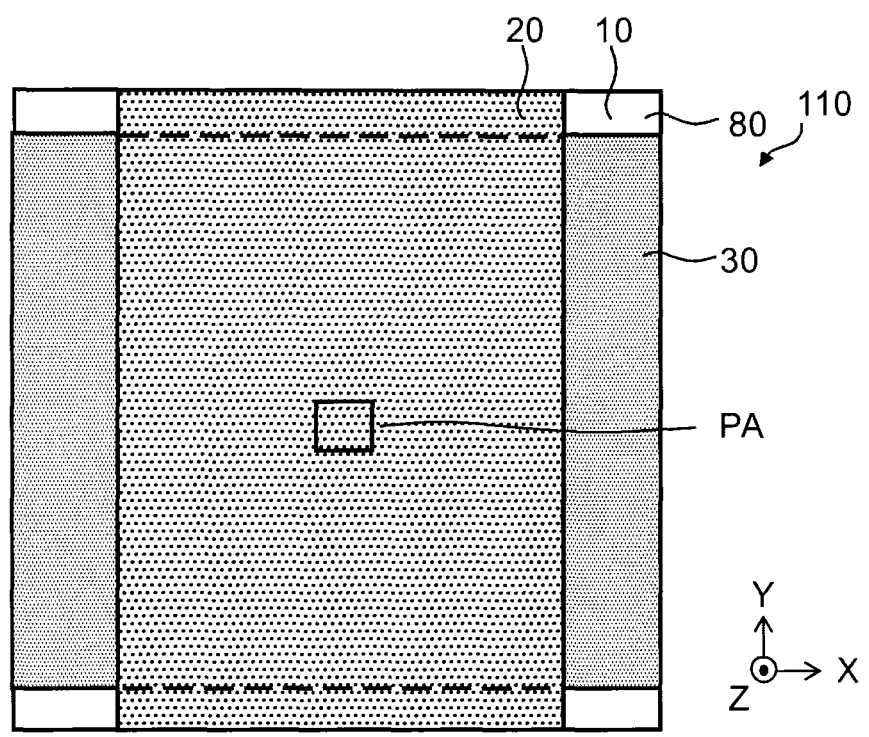
FIG. 3 is a schematic plan view illustrating the organic electroluminescent device according to the first embodiment.

FIG. 3 is a schematic plan view illustrating the organic electroluminescent device according to the first embodiment.

FIG. 1 and FIG. 2 already described illustrate the configuration of a portion PA of the organic electroluminescent device 110 illustrated in FIG. 3.

As shown in FIG. 3, the organic electroluminescent device 110 according to the embodiment has the first electrode 10, the interconnection portion 30 connected to the first electrode 10, and the second electrode 20 which faces the first electrode 10. In this example, the organic light emitting layer 40 is omitted. As viewed along the Z-axis, the organic electroluminescent device 110 appears to be, for example, square (for example, rectangular). Each side of the square is, for example, about not less than 20 mm and not more than 2000 mm. For example, the width of the first electrode 10 parallel to the X-Y plane is not less than 20 mm and not more than 2000 mm. For example, the width of the first electrode 10 parallel to the X-Y plane is not less than 50 mm.

Figure 4A:
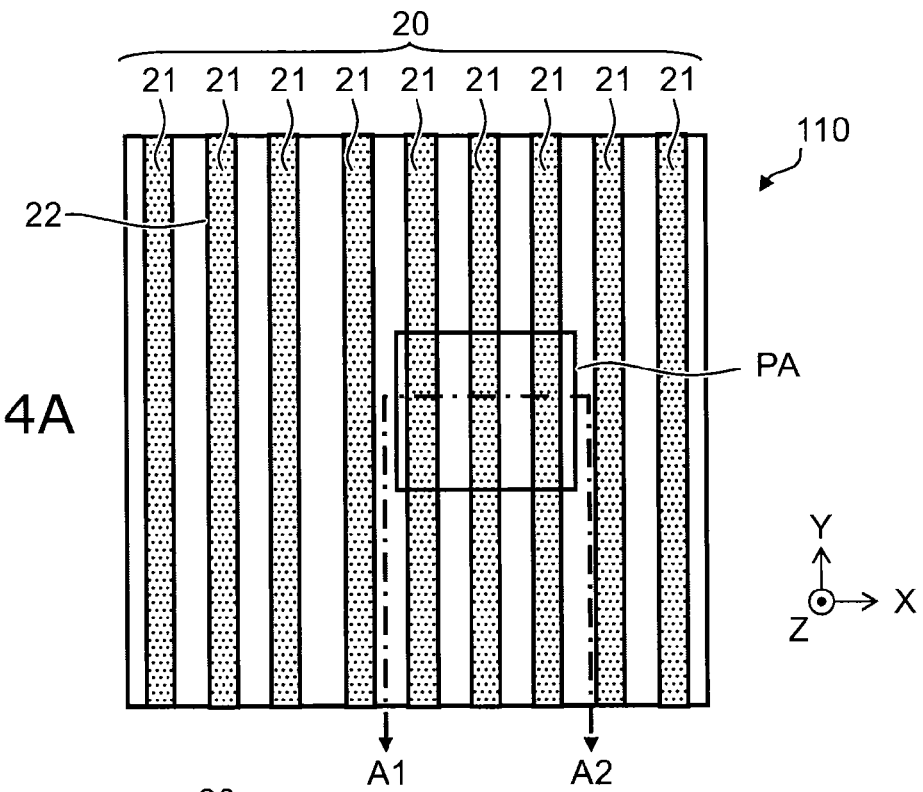
FIG. 4A and FIG. 4B are schematic plan views illustrating the organic electroluminescent device according to the first embodiment.
Figure 4B:
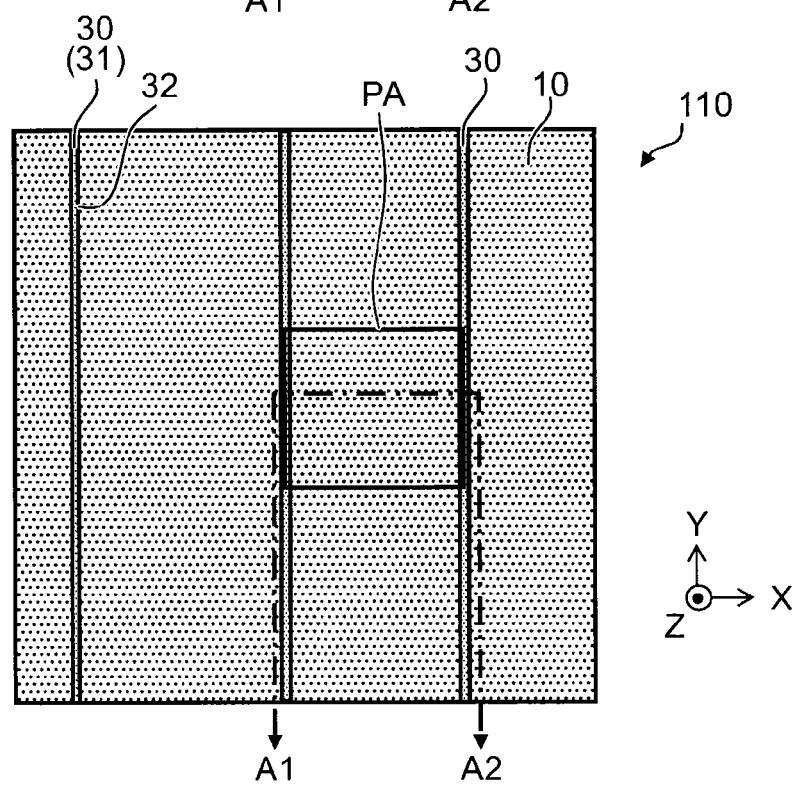

FIG. 4A and FIG. 4B are schematic plan views illustrating the organic electroluminescent device according to the first embodiment.

FIG. 4A shows an example of the pattern shape of the second electrode 20. FIG. 4B shows an example of the pattern shape of the interconnection portion 30. The portion PA of the organic electroluminescent device 110 shown in FIG. 4A and FIG. 4B corresponds to a portion illustrated in FIG. 1 and FIG. 2.

As shown in FIG. 4A, in this example, the second electrode 20 (conductive portion 21) is shaped like a strip. In this example, the second electrode 20 (conductive portion 21) extends along the Y-axial direction. In the embodiment, the direction in which the second electrode 20 (conductive portion 21) extends is arbitrary.

As shown in FIG. 4B, in this example, the interconnection portion 30 is shaped like a strip. In this example, the interconnection portion 30 extends along the Y-axial direction. In the embodiment, the direction in which the interconnection portion 30 extends is arbitrary.

In the embodiment, if the second electrode 20 (conductive portion 21) is strip-shaped and the interconnection portion 30 is strip-shaped, the relationship between the direction in which the strip of the second electrode 20 (conductive portion 21) extends and the direction in which the strip of the interconnection portion 30 extends is arbitrary. The direction in which the strip of the second electrode 20 (conductive portion 21) extends is parallel or non-parallel (sloped or perpendicular) to the direction in which the strip of the interconnection portion 30 extends. Examples of the pattern of the second electrode 20 (conductive portion 21) and the pattern of the interconnection portion 30 will be described later.

The following will describe examples of the layers included in the organic electroluminescent device 110.

FIG. 5 is a schematic cross-sectional view illustrating a portion of the organic electroluminescent device according to the first embodiment.

As shown in FIG. 5, the organic light emitting layer 40 includes a light emitting portion 43. The organic light emitting layer 40 can further include at least one of a first layer 41 and a second layer 42 as necessary. The light emitting portion 43 emits a light including the wavelength of a visible light. The first layer 41 is provided between the light emitting portion 43 and the first electrode 10. The second layer 42 is provided between the light emitting portion 43 and the second electrode 20.

As the material of the light emitting portion 43, for example, $Alq_3$ (tris(8-hydroxyquinolinolato) aluminum), F8BT(poly 9,9-dioctylfluorene-co-benzothiadiazole), and PPV(polyparaphenylene vinylene) can be used. The light emitting portion 43 can be made of a mixed material including a host material and a dopant to be added to the host material. As the host material, for example, CBP (4,4'-N,N'-bis-dicarbazolylbiphenyl), BCP (2.9-dimethyl-4,7-diphenyl-1,10-phenanthroline), TPD (4,4'-bis[N-(3-methyl phenyl)-N-phenylamino]biphenyl), PVK (polyvinyl carbazole), and PPT (poly(3-phenylthiophene)) can be used. As the dopant material, for example, FIrpic (iridium(III)bis(4,6-difluorophenyl)pyridinato-N,C2'-picolinate, $Ir(ppy)_3$(Tris(2-phenylpyridine)iridium), and FIr6(bis(2,4-difluorophenyl pyridinato)-tetrakis(1-pyrazolil) borate Iridium (III) can be used.

The first layer 41 functions as, for example, a hole injection layer. The first layer 41 functions as, for example, a hole transport layer. The first layer 41 may have, for example, a stacked structure including a layer which functions as the hole injection layer and a layer which functions as the hole transport layer. The first layer 41 may include another layer other than the layer which functions as the hole injection layer and the layer which functions as the hole transport layer.

The second layer 42 functions as, for example, an electron injection layer. The second layer 42 can include, for example, a layer which functions as an electron transport layer. The second layer 42 may have, for example, a stacked structure including a layer which functions as the electron injection layer and a layer which functions as the electron transport layer. The second layer 42 may include another layer other than the layer which functions as the electron injection layer and the layer which functions as the electron transport layer.

For example, the organic light emitting layer 40 emits light including visible light wavelengths. For example, the light emitted from the organic light emitting layer 40 is substantially white light. That is, the light emitted from the organic electroluminescent device 110 is white light. "White light" as referred to here is substantially white in color and includes, for example, red-based, yellow-based, green-based, blue-based, and purple-based white light.

The first electrode 10 includes an oxide including at least one element selected from a group including, for example, In, Sn, An, and Ti. The first electrode 10 can be formed of, for example, an indium tin oxide (ITO) film. The first electrode 10 functions as, for example, an anode.

The second electrode 20 includes at least one of, for example, aluminum and silver. For example, the second electrode 20 is formed of an aluminum film. Further, the second electrode 20 may be made of an alloy of silver and magnesium. Calcium may be added to this alloy. The second electrode 20 functions as, for example, a cathode.

The interconnection portion 30 includes at least one of a group including, for example, Mo, Ta, Nb, Ni, and Ti. The interconnection portion 30 may be, for example, a mixed film including an element selected from this group. The interconnection portion 30 may be a stacked film including those elements. The interconnection portion 30 may be a stacked film of, for example, Nb/Mo/Al/Mo/Nb. The interconnection portion 30 functions as an auxiliary electrode that suppresses a potential drop at, for example, the first electrode 10. The interconnection portion 30 can function as a lead electrode configured to supply a current.

The substrate 80 may be made of, for example, a glass substrate or a resin substrate.

FIG. 6A to FIG. 6D are schematic cross-sectional views illustrating a portion of the organic electroluminescent device according to the first embodiment.

Those figures illustrate the configuration of the light scattering portion 50.

As shown in FIG. 6A, the light scattering portion 50 includes a resin layer 55 and a plurality of particles 56 dispersed in the resin layer 55. The resin layer 55 is made of, for example, a polysiloxane-based polymer. However, the material of the resin layer 55 is arbitrary. The particle 56 may be at least one of, for example, a silica particle and a polyethylene particle. However, the material of the particle 56 is arbitrary. The diameter of the particle 56 is, for example, not less than 0.2 μm and not more than 100 μm. The thickness of the resin layer 55 is, for example, not less than 0.2 μm and not more than 100 μm.

The absolute value of a difference between the refractive index of the resin layer 55 and that of the particle 56 should preferably be, for example, not less than 0.1 and, more preferably, not less than 0.2. If the absolute value of the difference between the refractive index of the resin layer 55 and that of the particle 56 is small, scattering characteristics is lower. By setting the absolute value of the difference in refractive index not less than 0.1, sufficient scattering performance can be obtained. The particle 56 may be shaped like a ball (including a flattened ball), a polyhedral cube, and a needle.

For example, the refractive index of the resin layer 55 is equivalent to that of the substrate 80. The absolute value of the difference between the refractive index of the resin layer 55 and that of the substrate 80 is less than 0.2. The resin layer 55 is transparent.

As shown in FIG. 6B, in the light scattering portion 50, the plurality of particles 56 may be disposed to come in contact with each other.

As shown in FIG. 6C, in the light scattering portion 50, a portion of the surface of the particle 56 may be exposed.

As shown in FIG. 6D, as the light scattering portion 50, a transparent layer 57 having irregularities formed on its surface can be used. For example, as the light scattering portion 50, the transparent layer 57 having arbitrary irregularities are formed in its surface can be used, such as a microlens layer, a groove layer, or a pyramid layer. The transparent layer 57 may be made of a polysiloxane-based polymer. The transparent layer 57 may contain a component other than a resin such as filler.

The light scattering portion 50 is formed on, for example the back surface of the substrate 80 (opposite side surface of the substrate 80 with respect to the first electrode 10). The light scattering portion 50 can be formed by a method such as coating or printing by use of, for example, a raw material such as a solution of the resin layer 55 containing the particle 56. For example, the method may include spin coating, gravure printing, meniscus coating, capillary coating, and slit coating.

As described later, the light scattering portion 50 may be formed by a self-alignment method by use of the second electrode 20 and the interconnection portion 30.

As the light scattering portion 50, a sheet can be used in which microlens-shaped or pyramid-shaped irregularities are partially formed. A portion where the irregularities are formed provides the light scattering layer 51 and a portion where the irregularities are not formed provides the non-scattering portion 52. In the case of using such a sheet, an alignment mechanism is used to align, for example, the substrate 80 and this sheet so that they may be stuck to each other.

The light scattering portion 50 may employ a configuration in which, for example, the resin layer 55 in which the particles 56 are dispersed is stacked with the sheet having microlens-shaped or pyramid-shaped irregularities partially formed.

Figure 7A:
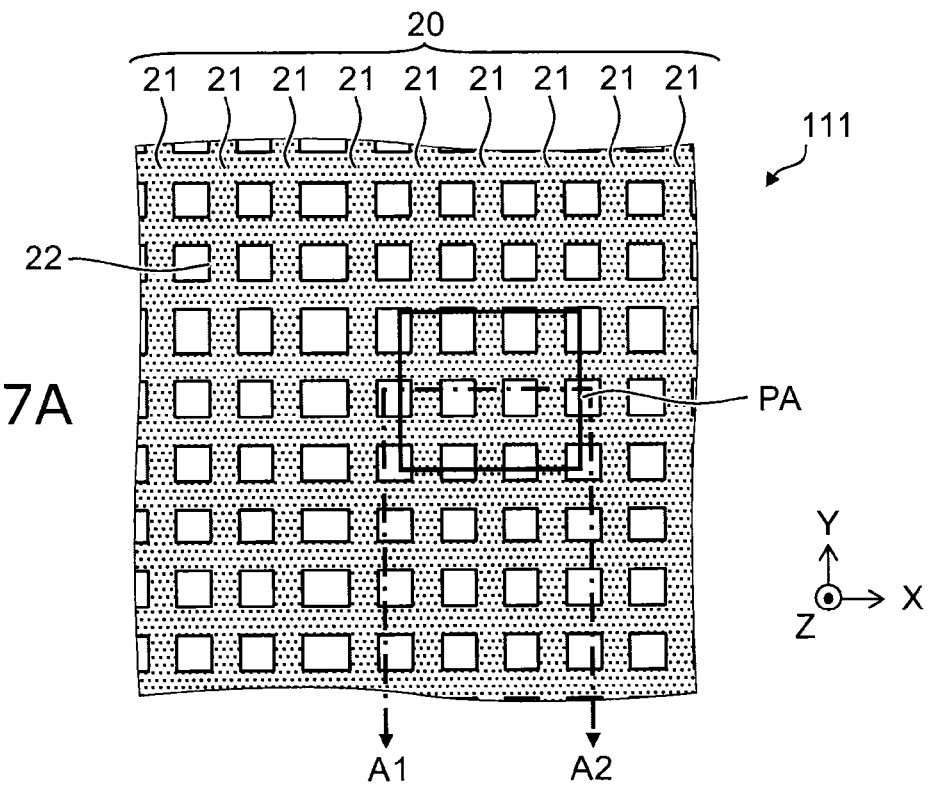
FIG. 7A and FIG. 7B are schematic plan views illustrating another organic electroluminescent device according to the first embodiment.
Figure 7B:
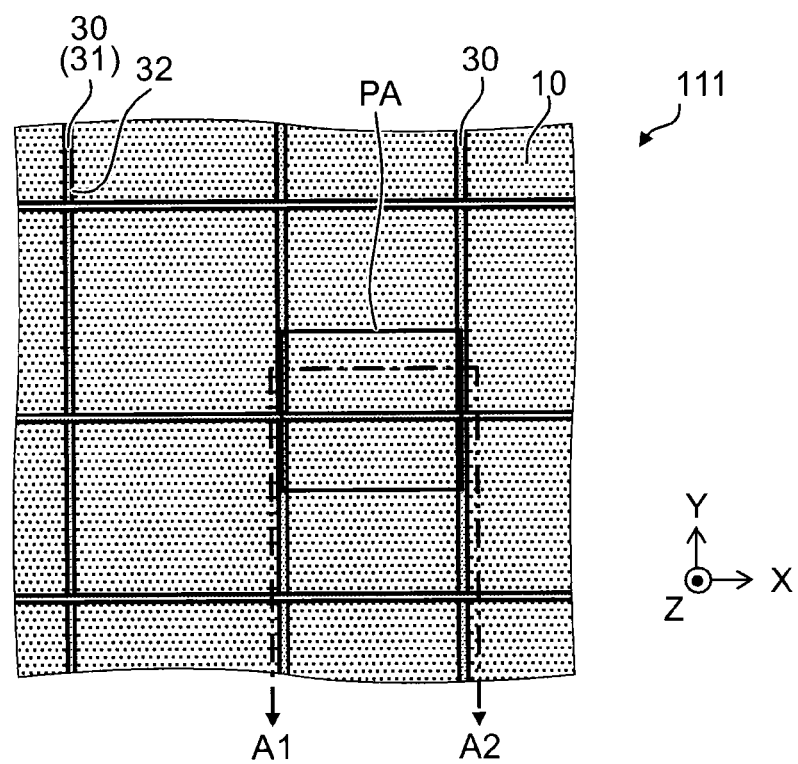

FIG. 7A and FIG. 7B are schematic plan views illustrating another organic electroluminescent device according to the first embodiment.

FIG. 7A shows an example of a pattern shape of the second electrode 20 of an organic electroluminescent device 111 according to the embodiment. FIG. 7B shows an example of the pattern shape of the interconnection layer 31 of the organic electroluminescent device 111. For example, cross-sectional views (taken along line A1-A2) of a portion of the organic electroluminescent device 111 shown in FIG. 7A and FIG. 7B are the same as FIG. 1.

As shown in FIG. 7A, in the organic electroluminescent device 111, the second electrode 20 (conductive portion 21) has a grid configuration. In this example, the shape of the conductive portion non-formation region 22 provided on the second electrode 20 is square (rectangular), however is not limited to square but arbitrary.

Further, as shown in FIG. 7B, the interconnection layer 31 has a grid configuration. In this example, the shape of the interconnection layer non-formation region 32 provided on the interconnection portion 30 is square (rectangular), however is not limited to square but arbitrary.

FIG. 8A and FIG. 8B are schematic plan views illustrating the organic electroluminescent device of the first embodiment.

FIG. 8A shows the configuration in a case where the second electrode 20 is strip-shaped and FIG. 8B shows the configuration in a case where the second electrode 20 is grid-shaped. As shown in FIG. 8A, the second electrode 20 (conductive portion 21) extends, for example, along the Y-axis direction. In such a manner, the second electrode 20 can include a plurality of strip-shaped portions (first pattern portions 20$p$) which extend in a first direction (Y-axis direction in this case) parallel to the first major surface 10$a$. An X-axis directional length of the second electrode 20 is taken to be a width wx2. An X-axis directional center-to-center distance of the two neighboring second electrodes 20 (conductive portions 21) among the plurality of second electrodes 20 (conductive portions 21) is taken to be a pitch px2.

As shown in FIG. 8B, the second electrode 20 (conductive portion 21) further has a portion (strip-shaped portion) which extends along the X-axis direction. In such a manner, the second electrode 20 can further include a plurality of second pattern portions 20$q$ which extend along a second direction (X-axis direction in this example) parallel to the first major surface 10$a$ and non-parallel to the first direction. The Y-axis directional length of the portion (strip-shaped portion, the second pattern portion 20$q$) of the second electrode 20 that extends along the X-axis direction is taken to be a width wy2. A Y-axis directional center-to-center distance of the above two portions neighboring in the Y-axis direction of the above portion (second pattern portion 20$q$) of the plurality of second electrodes 20 (conductive portions 21) is taken to be a pitch py2.

For example, at least one of the width wx2 and the width wy2 is not less than 1 μm and not more than 2000 μm. Specifically, at least one of the width wx2 and the width wy2 is not less than 10 μm. By setting the widths wx2 and wx2 not less than 10 μm, manufacture becomes easy. The widths wx2 and wy2 are not more than 500 μm. By setting the widths wx2 and wy2 not more than 500 μm, the second electrode 20 becomes less conspicuous. At least one of the widths wx2 and wy2 is, for example, not less than 10 μm and not more than 200 μm.

At least one of the pitches px2 and py2 is not less than 50 μm and not more than 5000 μm.

For example, the pitches px2 and py2 are set to not less than 400 μm and not more than 500 μm and the widths wx2 and wy2 are set not less than 40 μm and not more than 60 μm. In this case, the second electrode 20 can be formed by photolithography and etching.

For example, the pitches px2 and py2 are set to not less than 800 μm and not more than 1000 μm and the widths wx2 and wy2 are set not less than 80 μm and not more than 120 μm. In this case, the second electrode 20 can be formed by, for example, deposition (for example, vacuum evaporation, sputtering etc.) and patterned by use of a metal mask.

FIG. 9A and FIG. 9B are schematic plan views illustrating the organic electroluminescent device of the first embodiment.

FIG. 9A shows the configuration in a case where the interconnection layer 31 is strip-shaped and FIG. 9B shows the configuration in a case where the interconnection layer 31 is grid-shaped. As shown in FIG. 9A, the interconnection layer 31 extends, for example, along the Y-axis direction. That is, the interconnection layer 31 has a strip-shaped portion that extends, for example, along the Y-axis direction. The X-axis directional length of the interconnection layer 31 is taken to be a width wx3. An X-axis directional center-to-center distance of the two neighboring interconnection layers 31 among the plurality of interconnection layers 31 is taken to be a pitch px3.

As shown in FIG. 9B, the interconnection layer 31 further has a portion that extends along the X-axis direction. A Y-axis directional length of the portion (strip-shaped portion) of the interconnection layer 31 that extends along the X-axis direction is taken to be a width wy3. A Y-axis directional center-to-center distance of the above two neighboring portions among the above portions of the plurality of interconnection layers 31 is taken to be a pitch py3.

For example, at least one of the width wx3 and the width wy3 is not less than 1 μm and not more than 2000 μm. Specifically, at least one of the widths wx3 and wy3 is not less than 10 μm. By setting the widths wx3 and wy3 not less than 10 μm, manufacture becomes easy. Further, highly conductive interconnection layers 31 enhance in-plane uniformity of the emission intensity. On the other hand, the widths wx3 and wy3 are not more than 500 μm. By setting the widths wx2 and wy2 not more than 500 μm, the interconnection layer 31 becomes less conspicuous. At least one of the widths wx3 and wy3 is set, for example, not less than 10 μm and not more than 200 μm.

At least one of the pitches px3 and py3 is set, for example, not less than 50 μm and not more than 5000 μm.

For example, the pitches px3 and py3 are set not less than 400 μm and not more than 500 μm and the widths wx3 and wy3 are set not less than 40 μm and not more than 60 μm. In this case, the interconnection layer 31 can be formed by, for example, photolithography and etching.

For example, the pitches px3 and py3 are set not less than 800 μm and not more than 1000 μm and the widths wx3 and wy3 are set not less than 80 μm and not more than 120 μm. In this case, the interconnection layer 31 can be formed by, for example, deposition (for example, vacuum evaporation, sputtering etc.) and patterned by use of a metal mask.

In the embodiment, if the pattern line widths of the second electrode 20 and the interconnection portion 30 are large (the conductive portion 21 and the interconnection layer 31 are wide), the second electrode 20 and the interconnection portion 30 can be observed easily and is conspicuous. If the second electrode 20 and the interconnection portion 30 are conspicuous, it is difficult to recognize a background image.

The inventors of the application have discussed conditions for making the second electrode 20 and the interconnection portion 30 less conspicuous. In a specimen used in the discussion, a plurality of strip-shaped Ag films are provided on a glass substrate. The Ag films correspond to the second electrode 20 and the interconnection portion 30. The Ag film has a strip-shaped pattern pitch (which corresponds to the pitches py2 and py3) set to a constant value of 200 μm. The specimen used has a width of an Ag-film strip-shaped pattern (which corresponds to the widths wy2 and wy3) set to a variable value between 20 μm and 100 μm. It is noted that, when the width of the Ag-film strip-shaped pattern is 100 μm, an aperture ratio is 50%. By disposing white paper behind the specimen and setting a distance between the specimen and an observer to 0.3 m, an observable minimum width of the Ag-film strip-shaped pattern was obtained. The observer had eyesight of 1.2 and was inside the room under fluorescent light as an evaluation environment.

As a result, if the plurality of Ag-film strip-shaped patterns are not less than 50 μm, they could be observed to be separate from each other, whereas if they are not more than 40 μm (aperture ratio: 71%), they could not be observed. That is, if they are not more than 40 μm, the entirety of the specimen was observed as a gray region with a decreased transmittance. Further, if the width was 20 μm (aperture ratio: 83%), a difference between brightness of the region where the strip-shaped patterns were provided and that of the other region decreased, resulting in smaller sense of discomfort.

In such a manner, in the embodiment, the aperture ratio of the second electrode 20 (for example, ratio of a total of areas of the X-Y plane to which the plurality of conductive portion non-formation regions 22 with respect to the area of the X-Y plane to which the conductive portion 21 is projected) is, for example, not less than 71%. Further, the aperture ratio of the second electrode 20 is, for example, not less than 83%. By enhancing the aperture ratio of the second electrode 20, the transmittance of the organic electroluminescent device is improved. However, if the aperture ratio increases, the area of the light emitting region 44 decreases.

Similarly, in the embodiment, the aperture ratio of the interconnection portion 30 is, for example, not less than 71%. The aperture ratio of the interconnection portion 30 is, for example, not less than 83%.

In a display device, it is said that if the angle of sight of the width of one pixel as viewed from the observer is about not more than 0.028 degree, the pixel becomes invisible (indistinguishable). This substantially agrees with the above results that if the width is not more than 40 μm when a distance D between the specimen and the observer is 30 cm, the strip-shaped patterns cannot be seen.

Figure 10:
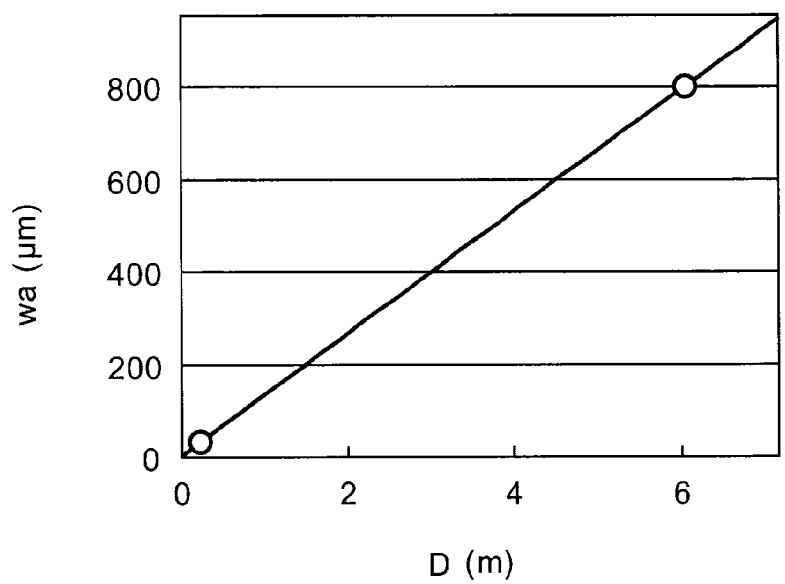
FIG. 10 is a graph illustrating characteristics of the organic electroluminescent device according to the first embodiment.

FIG. 10 is a graph illustrating characteristics of the organic electroluminescent device according to the first embodiment.

FIG. 10 illustrates a relationship between the distance D between the organic electroluminescent device and the observer and a pattern width wa at which the patterns cannot be observed. Its horizontal axis gives the distance D and its vertical axis gives the pattern width wa. The pattern width wa corresponds to the maximum widths wx2, wy2, wx3, and wxy3.

As shown in FIG. 10, the pattern width wa at which the patterns cannot be observed is proportional to the distance D. When the distance D is 0.3 m, the pattern width wa is 40 μm. When the distance D is 6 m, the pattern width wa is 800 μm.

In a case where the organic electroluminescent device according to the embodiment is used in lighting, the distance D between the relevant lighting apparatus and the user (observer) can be changed variously. In the embodiment, based on the distance D in accordance with usage, the widths wx2, wy2, wx3, and wy3 are determined.

The following will describe an example of usage of the organic electroluminescent device according to the embodiment. Although in the following, a case is assumed where the organic electroluminescent device 110 is used, the organic electroluminescent device 111 may be used.

Figure 11A:
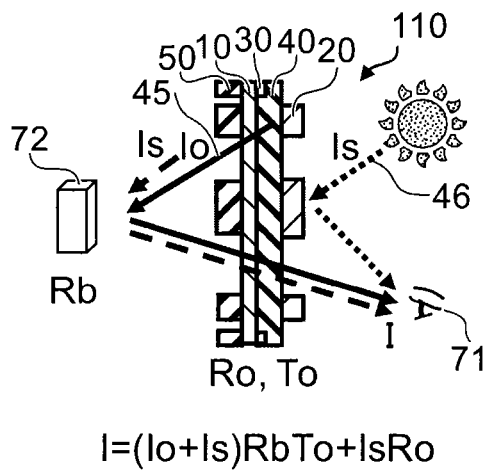
FIG. 11A and FIG. 11B are schematic views illustrating a usage state of the organic electroluminescent device according to the first embodiment.
Figure 11B:
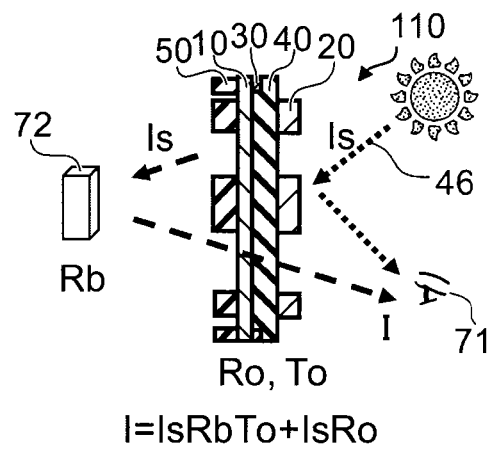

FIG. 11A and FIG. 11B are schematic views illustrating a usage state of the organic electroluminescent device according to the first embodiment.

FIG. 11A corresponds to a state (lighting state) where the emitted light 45 is radiated from the organic lighting layer 40 and FIG. 11B corresponds to a state (not lighting state) where the emitted light 45 is not being radiated from it. As shown in these figures, in this example, the second electrode 20 faces an observer 71 and the light scattering layer 51 faces an object 72.

As shown in FIG. 11A, in the lighting state, the object 72 is illuminated with the emitted light 45. Further, a portion of the external light 46 is reflected by the second electrode 20 and reaches the observer 71. Another portion of the external light 46 passes through the organic electroluminescent device 110, reaches the object 72, is reflected by the object 72, and reaches the observer 71 via the organic electroluminescent device 110. For example, it is taken that the reflection coefficient and the transmittance of the organic electroluminescent device 110 to be Ro and To, respectively and the reflection coefficient of the object 72 to be Rb. The intensity of the emitted light 45 is taken to be To and that of the external light 46, to be Is. In this case, the intensity I of light that reaches the observer 71 is (Io+Is)RbTo+IsRo.

As shown in FIG. 11B, in the not lighting state, the intensity I of light that reaches the observer 71 is IsRbTo+IsRo.

Figure 12A:
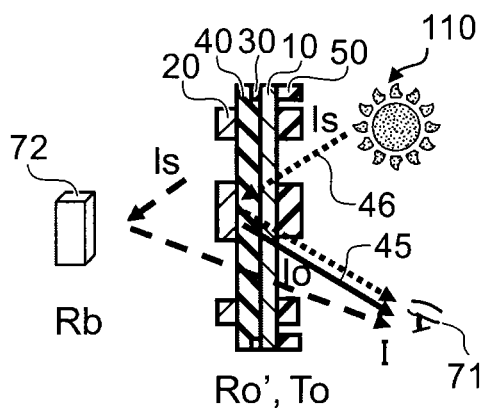
FIG. 12A and FIG. 12B are schematic views illustrating another usage state of the organic electroluminescent device according to the first embodiment.
Figure 12B:
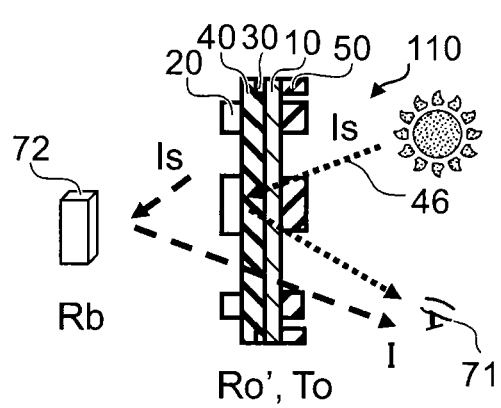

FIG. 12A and FIG. 12B are schematic views illustrating another usage state of the organic electroluminescent device according to the first embodiment.

FIG. 12A corresponds to the lighting state and FIG. 12B corresponds to the not lighting state. As shown in those figures, in this example, the light scattering layer 51 faces to the observer 71 and the second electrode 20 faces to the object 72.

As shown in FIG. 12A, in the lighting state, the emitted light 45 goes out toward the observer 71. Then, a portion of the external light 46 is reflected by the second electrode 20 and reaches the observer 71. Another portion of the external light 46 passes through the organic electroluminescent device 110, reaches the object 72, is reflected by the object 72, and reaches the observer 71 via the organic electroluminescent device 110. For example, the reflection coefficient and the transmittance of the organic electroluminescent device 110 are taken to be Ro' and To', respectively. The intensity of the light that reaches the observer 71 is IsRbTo+To+IsRo'.

As shown in FIG. 12B, in the lighting state, the intensity I of the light that reaches the observer 71 is IsRbTo+IsRo'.

In this usage state, in the not lighting state, the observer 71 can observe the object 72 via the organic electroluminescent device 110. In the lighting state, owing to the emitted light 45 emitted from the organic electroluminescent device 110, the observer 71 finds it difficult to see the object 72.

Figure 13:
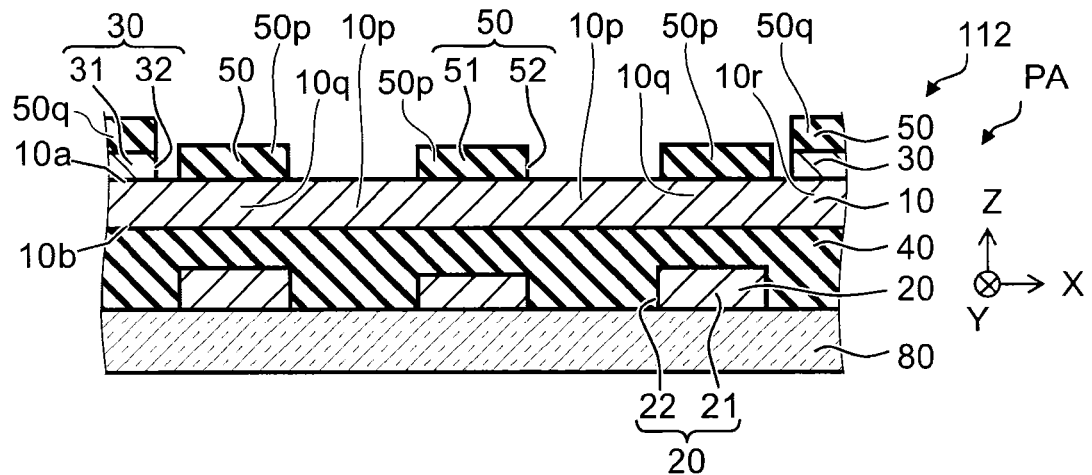
FIG. 13 is a schematic cross-sectional view illustrating another organic electroluminescent device according to the first embodiment.

FIG. 13 is a schematic cross-sectional view illustrating another organic electroluminescent device according to the first embodiment.

FIG. 13 is a cross-sectional view corresponding to the cross sections taken along line A1-A2 of FIG. 2, 4A, and FIG. 4B.

As shown in FIG. 13, in the another organic electroluminescent device 112 according to the embodiment, the second electrode 20 is provided on the substrate 80 and the organic light emitting layer 40 is provided on the second electrode 20. The first electrode 10 is provided on the organic light emitting layer 40 and the interconnection portion 30 is provided on the first electrode 10. The light scattering portion 50 is provided on the interconnection portion 30 and the upper surface of the first electrode 10. The organic electroluminescent device 112 also can provide a light transmissive organic electroluminescent device. It is also possible to provide the interconnection portion 30 on the organic light emitting layer 40 and the first electrode 10 on the interconnection portion 30.

Figure 14:
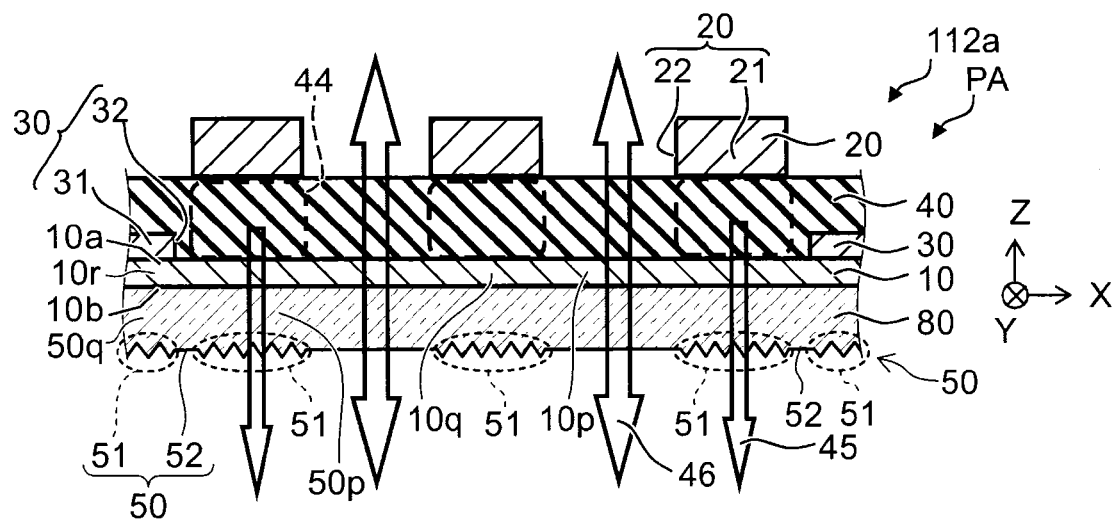
FIG. 14 is a schematic cross-sectional view illustrating another organic electroluminescent device according to the first embodiment.

FIG. 14 is a schematic cross-sectional view illustrating another organic electroluminescent device according to the first embodiment.

As shown in FIG. 14, in another organic electroluminescent device 112a according to the first embodiment, irregularities are formed in a portion of the opposite side surface of the substrate 80 with respect to the first electrode 10. The irregularities provide the light scattering layer 51 and the portion where the irregularities are not formed provides the non-scattering portion 52. In such a manner, at least a portion of the substrate 80 may be used as the light scattering portion 50.

Figure 15A:
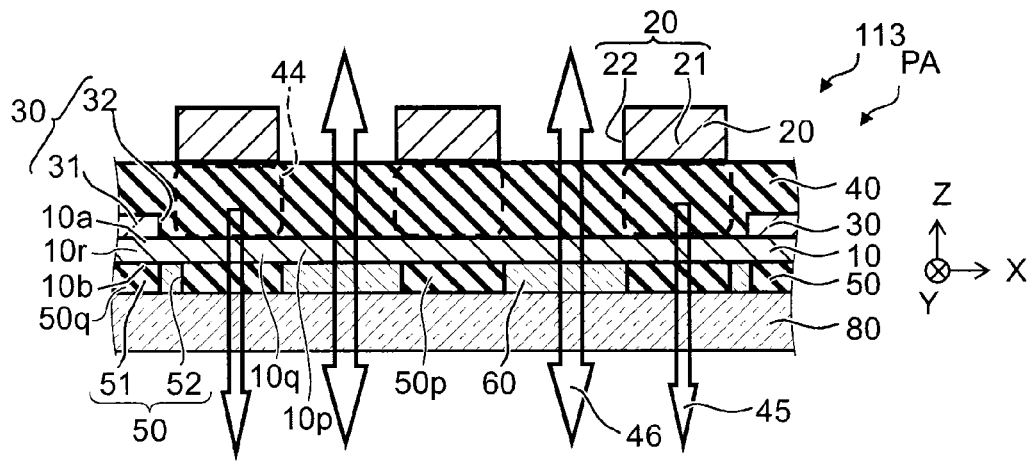
FIG. 15A to FIG. 15C are schematic cross-sectional views illustrating organic electroluminescent devices according to the first embodiment.
Figure 15B:
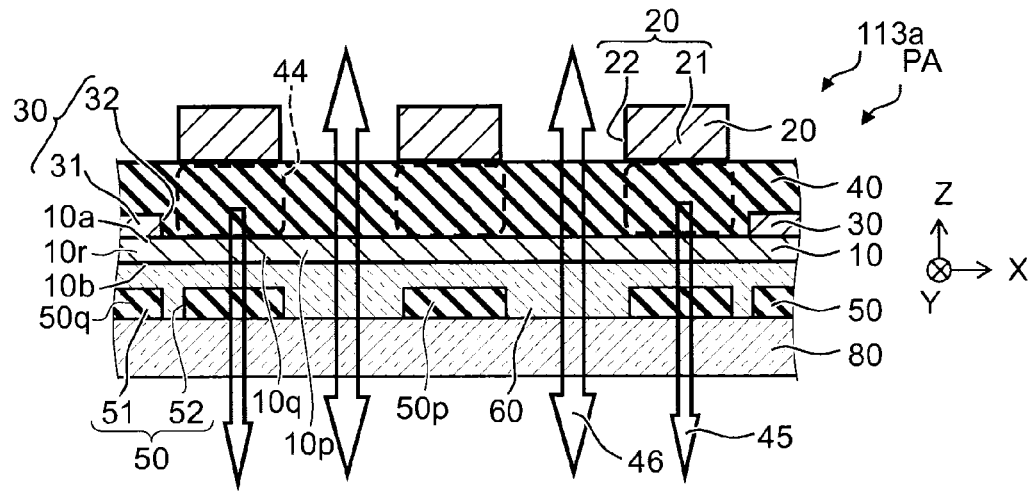
Figure 15C:
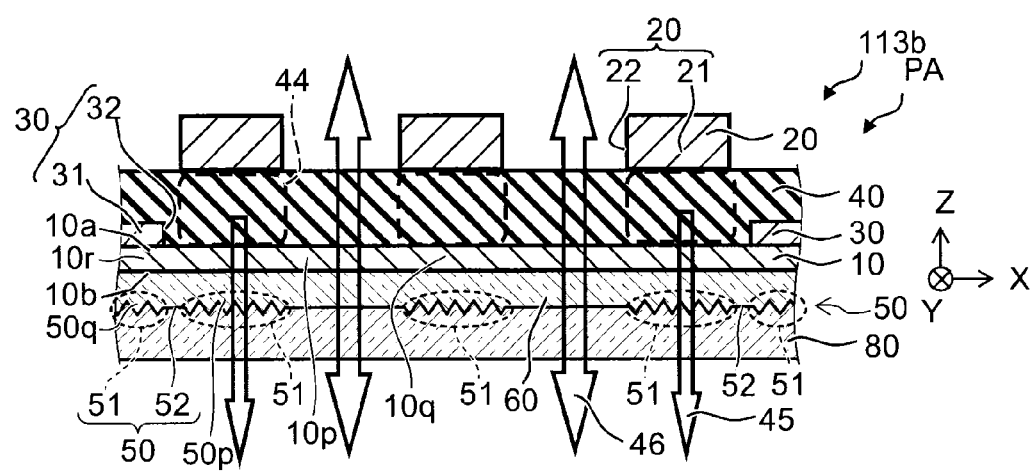

FIG. 15A to FIG. 15C are schematic cross-sectional views illustrating organic electroluminescent devices according to the first embodiment.

Those figures are cross-sectional views corresponding to the cross sections taken along line A1-A2 of FIG. 2, 4A, and FIG. 4B.

As shown in FIG. 15A, in another organic electroluminescent device 113 according to the embodiment, the light scattering portion 50 is provided between the substrate 80 and the first electrode 10. At a portion between the substrate 80 and the first electrode 10 where the light scattering layer 51 is not provided (A non-scattering portion 52), a transmission layer 60 which transmits the emitted light 45 is provided. The transmission layer 60 is made of, for example, transparent resin etc. The transmission layer 60 is provided as necessary and may be omitted. For example, on the substrate 80, the light scattering layer 51 and the transmission layer 60 are provided. The first electrode 10 is provided thereon, the interconnection portion 30 is provided on the first electrode 10, and the organic light emitting layer 40 is provided on the first electrode 10. The second electrode 20 is provided on the organic light emitting layer 40.

In the organic electroluminescent device 113, a distance between the reflective electrodes (second electrode 20) that forms an image due to reflection and the light scattering layer decreases. Accordingly, even if the angle for visual recognition changes, it is difficult to form an image by reflection.

As shown in FIG. 15B, in another organic electroluminescent device 113a according to the embodiment, the light scattering portion 50 is provided between the substrate 80 and the first electrode 10. The transmission layer 60 is provided so that the light scattering layer 51 may be embedded. That is, the transmission layer 60 is provided to the non scattering portion 52 (between the light scattering layers 51) and between the light scattering layer 51 and the first electrode 10.

As shown in FIG. 15C, in a further organic electroluminescent device 113b according to the embodiment, on the surface of the substrate 80 that faces the first electrode 10, the light scattering portion 50 is provided. That is, irregularities are formed in the surface of the substrate 80 to provide the light scattering layer 51. That is, at least a portion of the substrate 80 is used as the light scattering layer 51. The transmission layer 60 is provided between the substrate 80 and the first electrode 10. The transmission layer 60 flattens the irregularities. It is thus possible to, for example, form the first electrode 10 stably.

In such a manner, in the embodiment, the layers and the order in which the electrodes and the substrate are stacked can be changed variously.

Figure 16A:
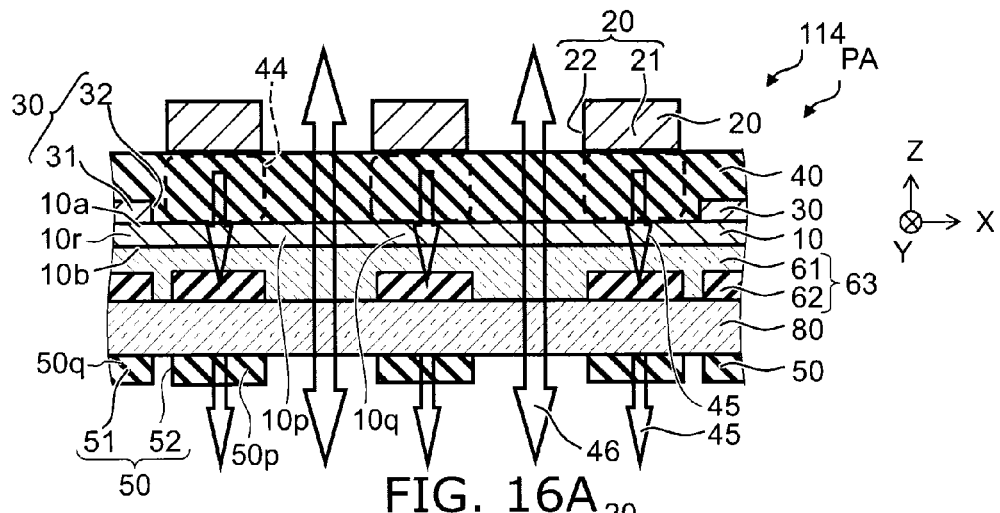
FIG. 16A to FIG. 16C are schematic cross-sectional views organic electroluminescent devices according to the first embodiment.
Figure 16B:
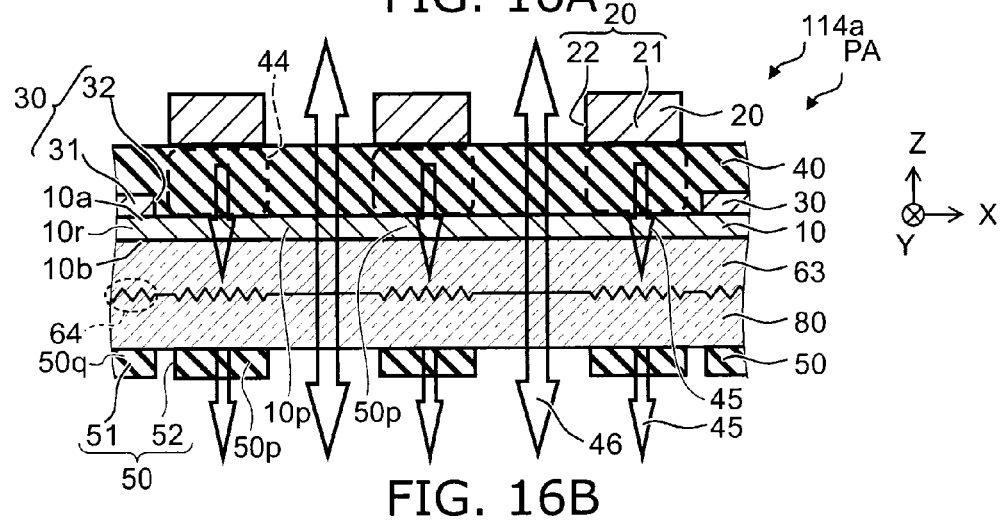
Figure 16C:
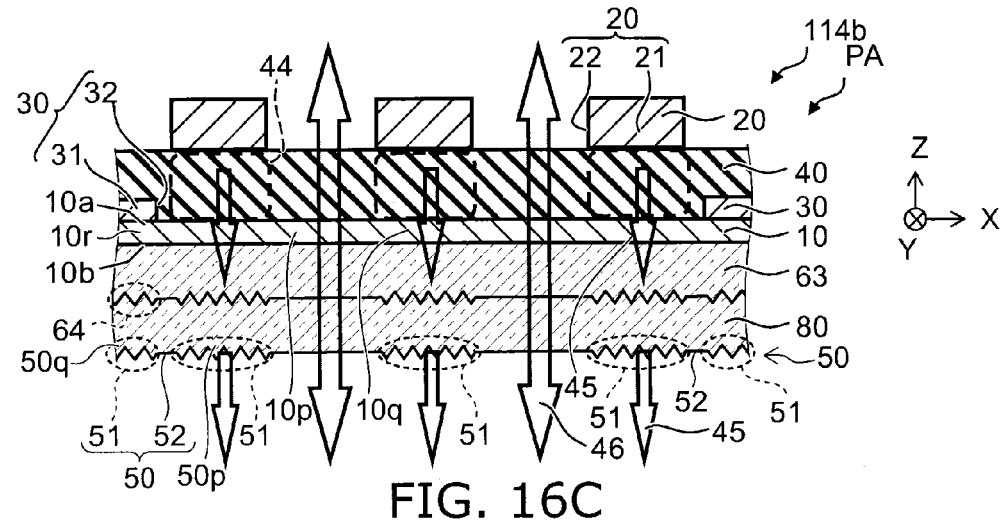

FIG. 16A to FIG. 16C are schematic cross-sectional views illustrating organic electroluminescent devices according to the first embodiment.

Those figures are cross-sectional views corresponding to cross sections taken along line A1-A2 of, for example, FIG. 2, FIG. 4A, and FIG. 4B.

As shown in FIG. 16A, another organic electroluminescent device 114 according to the embodiment, in the configuration of the organic electroluminescent device 110 described with reference to FIG. 1A to FIG. 1C, includes an intermediate layer 63 provided between the substrate 80 and the first electrode 10 (that is, between the light scattering portion 50 and the first electrode 10).

The intermediate layer 63 includes a high refractive-index portion 61 and an irregular-structure portion 62. The high refractive-index portion 61 is in contact with the first electrode 10. The refractive index of the high refractive-index portion 61 is almost the same as that of the first electrode 10. The absolute value of a difference between the refractive index of the high refractive-index portion 61 and that of the first electrode 10 is, for example, not more than 0.2. The refractive index of the high refractive-index portion 61 is not less than 1.8 and not more than 2.0. The refractive index of the high refractive-index portion 61 is almost the same as that of the organic light emitting layer 40. The high refractive-index portion 61 has a function to flatten the surface of the irregular-structure portion 62.

The irregular-structure portion 62 is in contact with the substrate 80. The irregular-structure portion 62 has a portion that overlays the interconnection layer 31 and the conductive portion 21 when it is projected to the X-Y plane. The irregular-structure portion 62 is provided except at least a portion of a region that does not overlay the interconnection layer 31 or the conductive portion 21 when it is projected to the X-Y plane. The irregular-structure portion 62 has substantially the same pattern shape as that of, for example, the light scattering layer 51.

As the irregular-structure portion 62, at least one of a resin layer in which particles are scattered and a layer partially having microlens-shaped or pyramid-shaped irregularities formed on it can be used.

In the organic electroluminescent device 114, light that propagates at least one of the inside of the organic light emitting layer 40 and the inside of the first electrode 10 can be taken out. It is thus possible to obtain a higher luminous efficiency.

As shown in FIG. 16B, in another organic electroluminescent device 114a of the embodiment, the intermediate layer 63 is provided between the substrate 80 and the first electrode 10, so that irregularities 64 are formed in a portion of a surface of the substrate 80 that corresponds to the intermediate layer 63. The irregularities 64 correspond to the irregular-structure portion 62. In this case also, light that propagates at least one of the inside of the organic light emitting layer 40 and the inside of the first electrode 10 can be taken out.

As shown in FIG. 16C, in another organic electroluminescent device 114b according to the embodiment, the irregularities 64 are formed and, further, irregularities are formed in a portion of the opposite side surface of the substrate with respect to the first electrode 10 so that those irregularities may provide the light scattering layer 51 and the portion where the irregularities are not formed may provide the non-scattering portion 52.

(second Embodiment)

Figure 17:
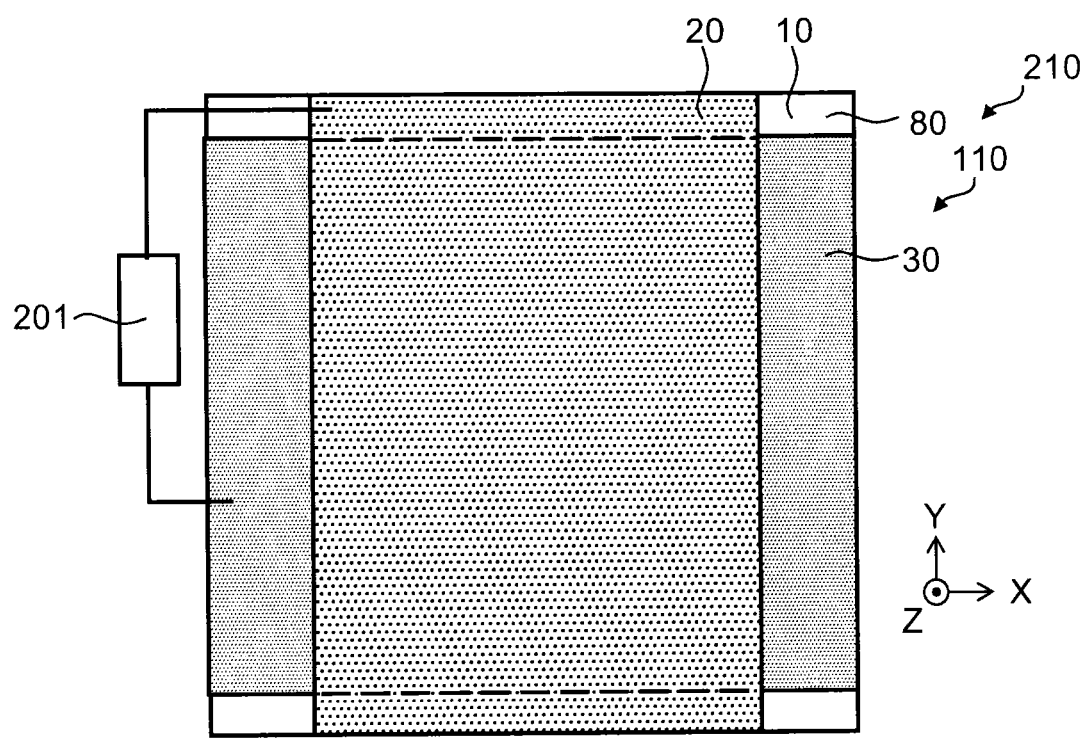
FIG. 17 is a schematic view illustrating a lighting apparatus according to a second embodiment.

FIG. 17 is a schematic view illustrating a lighting apparatus according to a second embodiment.

As shown in FIG. 17, a lighting apparatus 210 according to the embodiment includes an organic electroluminescent device (for example, the organic electroluminescent device 110) according to the first embodiment and a power supply unit 201.

The power supply unit 201 is electrically connected to an interconnection portion 30 and a second electrode 20. The power supply unit 201 supplies a current passing through an organic light emitting layer 40 via an interconnection portion 30, a first electrode 10, and the second electrode 20.

The lighting apparatus 210 according to the embodiment can provide a light transmissive lighting apparatus.

(Third Embodiment)

The embodiment relates to a method for manufacturing an organic electroluminescent device. The embodiment corresponds partially to a method for manufacturing a lighting apparatus.

FIG. 18A to FIG. 18E are schematic cross-sectional views illustrating a method for manufacturing an organic electroluminescent device according to a third embodiment in order of processes.

As shown in FIG. 18A, a first electrode 10 is formed on, for example, a substrate 80. An interconnection portion 30 is formed on the first electrode 10. A pattern of the interconnection portion 30 is formed using, for example, photolithography and etching. Film deposition (vacuum evaporation etc.) patterned by use of masks may be used.

As shown in FIG. 18B, an organic light emitting layer 40 is formed on the first electrode 10 and the interconnection portion 30. On the organic light emitting layer 40, a second electrode 20 is formed. In such a manner, a workpiece 110w is formed. The second electrode 20 pattern is formed using, for example, photolithography and etching. Film formation (evaporation etc.) by use of masks may be used.

As shown in FIG. 18C, a light scattering film 50f forming the light scattering layer 51 is formed on the back surface (a processing surface 110ws) of the substrate 80 (which is a lower surface and the opposite side surface of the substrate 80 with respect to the first electrode 10). The light scattering film 50f is, for example, photosensitive. The light scattering film 50f is a photosensitive resin film 59. In this example, the light scattering film 50f is taken to be positive in type.

As shown in FIG. 18D, the upper surface of the workpiece is irradiated with an exposure light 75. The exposure light 75 is blocked by the second electrode 20 (conductive portion 21) and the interconnection portion 30 (interconnection layer 31). The light scattering film 50f is irradiated with a portion of the exposure light 75 that passes through a conductive portion non-formation region 22 and an interconnection layer non-formation region 32.

Then, as shown in FIG. 18E, the portion of the light scattering film 50f that is irradiated with the light can be removed to form the light scattering layer 51.

In this example, the light scattering layer 51 is formed in self-alignment with the second electrode 20 (conductive portion 21) and the interconnection portion 30 (interconnection layer 31). The shape of the light scattering layer 51 substantially overlays the shapes of the second electrode 20 (conductive portion 21) and the interconnection portion 30 (interconnection layer 31) and thus has high processing accuracy. This method enables the light scattering layer 51 to be easily manufactured.

FIG. 19A to FIG. 19D are schematic cross-sectional views illustrating another method for manufacturing the organic electroluminescent device according to the third embodiment in order of processes.

Figure 19A:
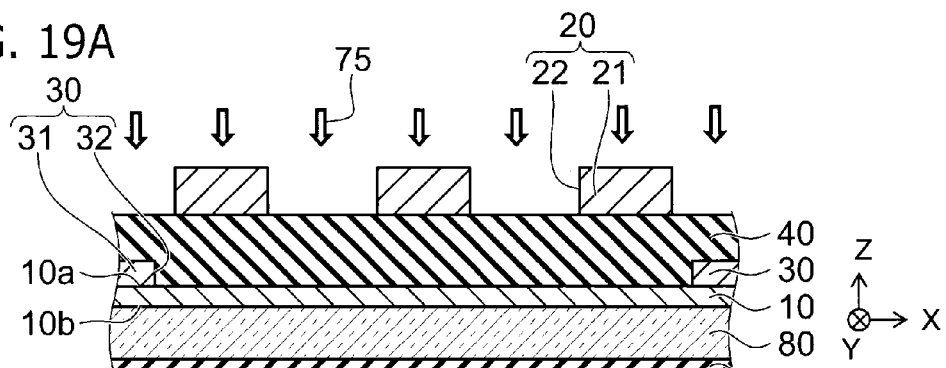
FIG. 19A to FIG. 19D are schematic cross-sectional views illustrating another method for manufacturing the organic electroluminescent device according to the third embodiment in order of processes.

As shown in FIG. 19A, for example, after forming the workpiece 110w including the first electrode 10, the interconnection portion 30, the organic light emitting layer 40, and the second electrode 20 on the substrate 80, a photosensitive resist film 58 is formed on the back surface of the substrate 80 (which is a lower surface and the opposite side surface of the substrate 80 with respect to the first electrode 10). The resist film 58 is the photosensitive resin film 59 and a negative-type resist. Then, the upper surface of the workpiece is irradiated with the exposure light 75. The exposure light 75 is blocked by the second electrode 20 (conductive portion 21) and the interconnection portion 30 (interconnection layer 31), so that the resist film 58 is irradiated with a portion of this exposure light 75 that passes through the conductive portion non-formation region 22 and the interconnection layer non-formation region 32.

Figure 19B:
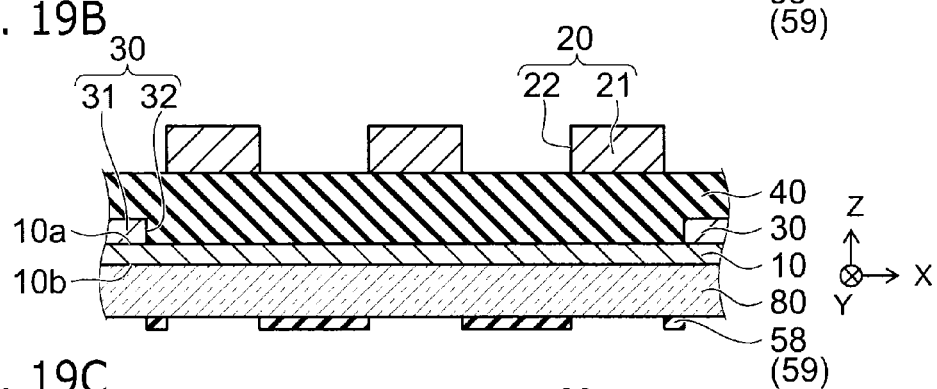

As shown in FIG. 19B, for example, a portion of the resist film 58 that is not irradiated with the light is removed.

Figure 19C:
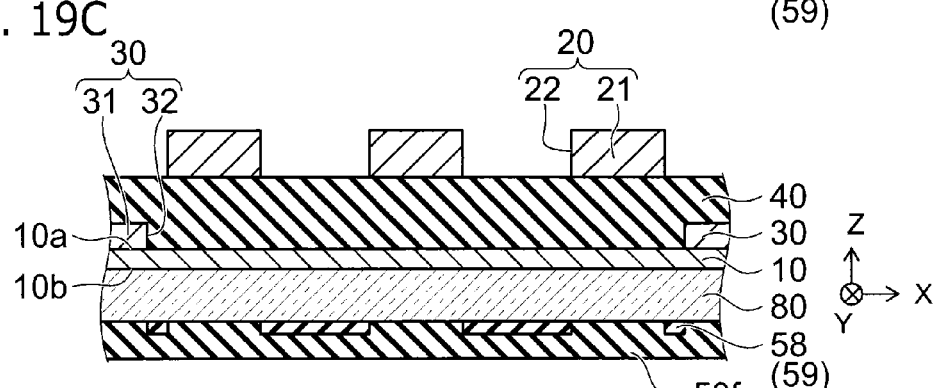

As shown in FIG. 19C, the light scattering film 50f is formed so as to cover the resist film 58 on the back surface (lower surface) of the substrate 80.

Figure 19D:
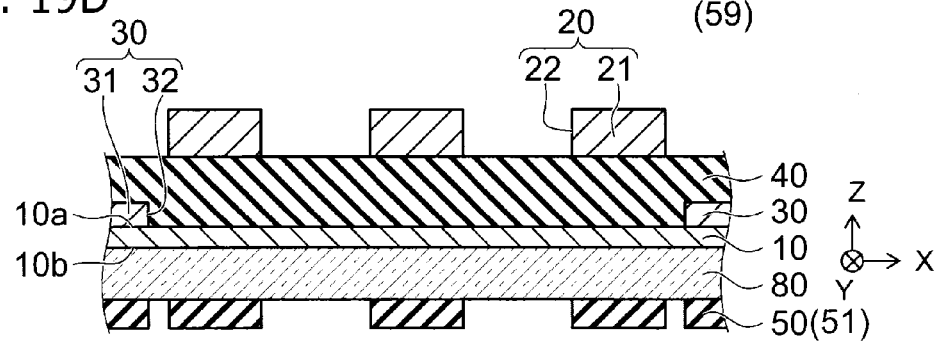

As shown in FIG. 19D, the light scattering film 50f on the resist film 58 is removed by removing the resist film 58. By this method, the light scattering layer 51 is formed by processing the light scattering film 50f by using the liftoff method.

In this example, the light scattering layer 51 is formed in self-alignment with the second electrode 20 (conductive portion 21) and the interconnection portion 30 (interconnection layer 31). The shape of the light scattering layer 51 substantially overlays the shapes of the second electrode 20 (conductive portion 21) and the interconnection portion 30 (interconnection layer 31) and has processing accuracy. This method enables the light scattering layer 51 to be easily manufactured.

Figure 20:
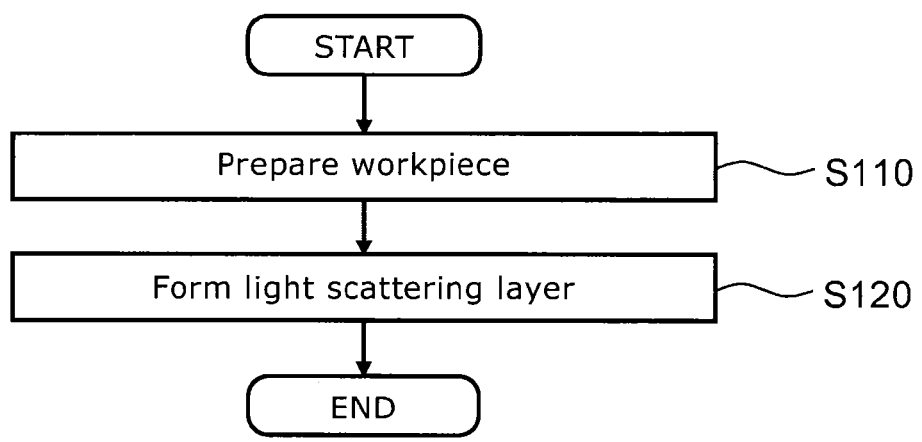
FIG. 20 is a flowchart illustrating the method for manufacturing the organic electroluminescent device according to the third embodiment.

FIG. 20 is a flowchart illustrating the method of manufacturing the organic electroluminescent device according to the third embodiment.

As shown in FIG. 20, in the manufacturing method, the workpiece 110w is prepared (step S110). The workpiece 110w includes the first electrode 10, the interconnection portion 30, the second electrode 20, and the organic light emitting layer 40. The first electrode 10 has a first major surface 10a and is light transmissive. The interconnection portion 30 extends in a plane parallel to the first major surface 10a and is electrically connected to the first electrode 10. The interconnection portion 30 is more conductive than the first electrode 10 and is light reflective. The first electrode 10 has a portion that does not overlay the interconnection layer 31 when projected to the X-Y plane. The second electrode 20 faces the first major surface 10a. The second electrode 20 has a conductive portion 21. The conductive portion 21 is light reflective. The conductive portion 21 is provided on a portion of the region that does not overlay the interconnection layer 31 when projected to the X-Y plane. The conductive portion 21 is provided except in the conductive portion non-formation region 22. The conductive portion non-formation region 22 is provided on at least a portion of the region that does not overlay the interconnection layer 31 when projected to the X-Y plane. The organic light emitting layer 40 is provided between the first major surface 10a and the second electrode 20.

For example, the first electrode 10 and the interconnection portion 30 are formed on the light transmissive substrate 80, the organic light emitting layer 40 is formed on the first electrode 10, and the second electrode 20 is formed on the organic light emitting layer 40. For example, the processing described with reference to FIG. 18A and FIG. 18B is performed.

Then, as shown in FIG. 20, the light scattering portion 50 is formed on the surface (the processing surface) of the workpiece 110w that is parallel to the X-Y plane by performing exposure processing using the interconnection portion 30 and the second electrode 20 as masks (step S120). The light scattering portion 50 is formed at a position where the first electrode 10 is disposed between the light scattering portion 50 and the second electrode 20. In this step, the light scattering layer 51 is formed in a region that overlays the interconnection layer 31 and the conductive portion 21 when projected to the X-Y plane except at least a portion that overlays none of the interconnection layer 31 and the conductive portion 21 when projected to the X-Y plane (region on the surface of the workpiece 110w that is parallel to the X-Y plane).

In the formation of the light scattering portion 50, for example, the photosensitive resin film 59 is formed on the surface of the workpiece 110w that is parallel to the X-Y plane. The resin film 59 is formed at a position where the first electrode 10 is disposed between the resin film 59 and the second electrode 20. The resin film 59 is, for example, the light scattering film 50f. Then, a process is included to irradiate the resin film 59 with the light (exposure light 75) developing photosensitivity by using the interconnection portion 30 and the second electrode 20 as masks to shape the resin film 59 into a pattern on which the pattern shapes of the interconnection portion 30 and the second electrode 20 are reflected.

For example, the light scattering portion 50 is formed on the lower surface of the substrate 80. In the formation of the light scattering portion 50, the photo-reactive resin film 59 (light scattering film 50f) is formed on the lower surface of the substrate 80. Then, the resin film 59 (light scattering film 50f) is irradiated with the light (exposure light 75) coming from the side of the upper surface of the substrate 80, by using the interconnection portion 30 and the second electrode 20 as masks. In such a manner, the resin film 59 (light scattering film 50f) is processed into a pattern on which the pattern shapes of the interconnection portion 30 and the second electrode 20 are reflected. For example, the processing described with reference to FIG. 18C and FIG. 18D is performed.

For example, the resin film 59 may be the resist film 58. The resist film 58 is irradiated with the exposure light 75 by using the interconnection portion 30 and the second electrode 20 as masks so that the resist film 58 may be processed into a pattern on which the pattern shapes of the interconnection portion 30 and the second electrode 20 are reflected. Then, the light scattering film 50f is processed using the resist film 58 processed into the predetermined pattern, thereby obtaining the light scattering layer 51. For example, the processing described with reference to FIG. 19A to FIG. 19D is performed.

In the first through third embodiments, by thinning the conductive portion 21 and the interconnection layer 31 having reflectivity, a region is provided which overlays neither of the conductive portion 21 or the interconnection layer 31 when projected to the X-Y plane. In such a manner, transparency is added to the organic electroluminescent device. Then, by providing the light scattering layer 51 in the region that overlays both of the conductive portion 21 and the interconnection layer 31, the formation of glare is suppressed. The light-extraction efficiency of the emitted light 45 is improved. It is thus possible to improve the luminous efficiency without decreasing the transmittance.

By reducing a line width of the conductive portion 21 and the interconnection layer 31 or shaping them like a grid and forming the line width so that it cannot be visually recognized, the second electrode 20 and the interconnection portion 30 become inconspicuous (cannot be visually recognized). As viewed from a position distant by 1 m, the visually unrecognizable line width is, for example, about not more than 100 μm (for example, not more than 120 μm). For example, by setting the line width of the conductive portion 21 and the interconnection layer 31 not more than 120 μm, the second electrode 20 and the interconnection portion 30 cannot be visually recognized as a line.

In the organic electroluminescent device and the lighting apparatus according to the embodiment, they can be realized to give transparency so that a background image can be visually recognized, well match an atmosphere, and have a luminous efficiency.

The embodiment provides optically transparent organic electroluminescent device and lighting apparatus as well as a method of manufacturing them.

Hereinabove, the embodiments of the invention have been described with reference to the specific examples. However, the embodiments of the invention are not limited to those specific examples. For example, the specific configurations of the components of the first electrode, the second electrode, the interconnection layer, the organic light emitting layer, the light scattering layer and the substrate included in the organic electroluminescent device as well as the components such as the power supply unit included in the lighting apparatus are covered by the invention as long as those skilled in the art can obtain the same effects by similarly carrying out the invention by appropriately selecting them from the publicly known scope.

Further, any two or more components of the specific examples may be combined within the extent of technical feasibility and are included in the scope of the invention to the extent that the purport of the invention is included.

Moreover, all organic electroluminescent devices practicable by an appropriate design modification by one skilled in the art based on the organic electroluminescent devices, the lighting apparatus and the method for manufacturing the electroluminescent device described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent device comprising:
a first electrode having a major surface and including a first portion, a second portion arranged with the first portion in a first direction parallel to the major surface and a third portion arranged with the first portion in the first direction, the first electrode being light transmissive;
an interconnection layer extending in a plane parallel to the major surface, the interconnection layer being light-reflective and electrically connected to the first electrode, and having a conductivity higher than a conductivity of the first electrode, the third portion overlaying the interconnection layer when projected to the plane, and the first portion and the second portion not overlaying the interconnection layer when projected to the plane;
a second electrode being light-reflective, the second electrode overlaying the second portion and not overlaying the first portion and the third portion when projected to the plane;
an organic light emitting layer provided between the second portion and the second electrode; and
a light scattering layer including a fourth portion and a fifth portion arranged with the fourth portion in a direction parallel to the major surface, the second portion being disposed between the fourth portion and the second electrode, the fifth portion overlaying the interconnection layer when projected to the plane, and the light scattering layer not overlaying the first portion when projected to the plane.

2. The device according to claim 1, further comprising a substrate provided between the first electrode and the light scattering layer, the substrate being light transmissive.

3. The device according to claim 2, further comprising an intermediate layer provided between the substrate and the first electrode and including an irregular structure portion.

4. The device according to claim 1, wherein the second electrode has a width not less than 1 micrometer and not more than 2000 micrometers.

5. The device according to claim 1, wherein
the interconnection layer has a strip-shaped portion extending along a direction parallel to the plane, and
a width of the interconnection layer is not less than 1 micrometer and not more than 2000 micrometers, the width being along the direction perpendicular to the extending direction of the strip-shaped portion of the interconnection layer and parallel to the plane.

6. The device according to claim 1, wherein the interconnection layer includes at least one selected from the group consisting of Mo, Ta, Nb, Al, Ni, and Ti.

7. The device according to claim 1, wherein a width of the first electrode along a direction parallel to the plane is not less than 20 millimeters.

8. The device according to claim 1, wherein a light emitted from the organic light emitting layer is a white light.

9. The device according to claim 1, wherein the second electrode includes a plurality of strip-shaped first pattern portions extending in a first direction parallel to the major surface.

10. The device according to claim 9, wherein the second electrode further including a plurality of strip-shaped second pattern portions extending along a second direction parallel to the major surface and non-parallel to the first direction.

11. The device according to claim 1, wherein the second electrode includes at least one of aluminum and silver.

12. The device according to claim 1, wherein the light scattering layer includes a resin layer and a plurality of particles, the particles being dispersed in the resin layer and having an average diameter not less than 200 nanometers and not more than 100 micrometers.

13. The device according to claim 12, wherein an absolute value of a difference between a refractive index of the resin layer and a refractive index of the particles is not less than 0.1.

14. The device according to claim 1, wherein the light scattering layer changes a travel direction of a light emitted from the organic light emitting layer.

15. The device according to claim 1, wherein the light scattering layer scatters a light reflected by the interconnection layer and the second electrode.

16. The device according to claim 1, wherein the light scattering layer scatters an external light incident upon at least one of the interconnection layer and the second electrode.

17. The device according to claim 1, wherein the second electrode has a grid pattern.

18. A lighting apparatus comprising:
an organic electroluminescent device including
a first electrode having a major surface and including a first portion, a second portion arranged with the first portion in a first direction parallel to the major surface and a third portion arranged with the first portion in the first direction, the first electrode being light transmissive,
an interconnection layer extending in a plane parallel to the major surface, the interconnection layer being light-reflective and electrically connected to the first electrode, and having a conductivity higher than a conductivity of the first electrode, the third portion overlaying the interconnection layer when projected to the plane, and the first portion and the second portion not overlaying the interconnection layer when projected to the plane,
a second electrode being light-reflective, the second electrode overlaying the second portion and not overlaying the first portion and the third portion when projected to the plane,
an organic light emitting layer provided between the second portion and the second electrode, and
a light scattering layer including a fourth portion and a fifth portion arranged with the fourth portion in a direction parallel to the major surface, the second portion being disposed between the fourth portion and the second electrode, the fifth portion overlaying the interconnection layer when projected to the plane, and the light scattering layer not overlaying the first portion when projected to the plane; and a power supply unit electrically connected to the interconnection layer and the second electrode, and configured to supply a current passing through the organic light emitting layer via the interconnection layer, the first electrode, and the second electrode.

* * * * *